(12) United States Patent
Yamada et al.

(10) Patent No.: US 6,376,897 B2
(45) Date of Patent: *Apr. 23, 2002

(54) LATERAL BIPOLAR TRANSISTOR FORMED ON AN INSULATING LAYER

(75) Inventors: Takashi Yamada, Ebina; Hideaki Nii, Kawasaki; Makoto Yoshimi; Tomoaki Shino, both of Tokyo-To; Kazumi Inoh; Shigeru Kawanaka, both of Yokohama; Tsuneaki Fuse; Sadayuki Yoshitomi, both of Tokyo-To, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/314,114

(22) Filed: May 19, 1999

(30) Foreign Application Priority Data

May 19, 1998 (JP) ............................................. 10-137131

(51) Int. Cl.$^7$ ..................... H01L 29/00; H01L 27/082; H01L 27/102; H01L 29/70; H01L 27/01
(52) U.S. Cl. ..................... 257/557; 257/347; 257/558; 257/559; 257/571; 257/586; 257/592
(58) Field of Search ................................. 257/565, 571, 257/586, 592, 557, 558, 578, 347, 559; 438/155

(56) References Cited

U.S. PATENT DOCUMENTS

| 5,100,810 A | 3/1992 | Yoshimi et al. ............. 438/155 |
| 5,376,823 A | * 12/1994 | Kojima et al. .............. 257/578 |
| 5,510,647 A | 4/1996 | Nakajima et al. ........... 257/559 |

OTHER PUBLICATIONS

James C. Sturm, et al., IEEE Electron Device Letters, vol. EDL–8, No. 3, pp. 104–106, "A Lateral Silicon–on–Insulator Biopolar Transistor with a Self–Aligned Based Contact," Mar. 1987.

G. G. Shahidi, et al., Technical Digest of 1991 International Electron Devices Meeting, pp. 663–666, " A Novel High–Performance Lateral Ipolar on SOI, "1991.

* cited by examiner

Primary Examiner—Steven Loke
(74) Attorney, Agent, or Firm—Oblon, Spivak, McClelland, Maier & Neustadt, P.C.

(57) ABSTRACT

In a bipolar transistor improved to exhibit an excellent high-frequency property by decreasing the width of the intrinsic base with without increasing the base resistance, an emitter region, intrinsic base region and collector region are closely aligned on an insulating layer, and the intrinsic base region and the collector region make a protrusion projecting upward from the substrate surface. The protrusion has a width wider than the width of the intrinsic base region.

10 Claims, 39 Drawing Sheets

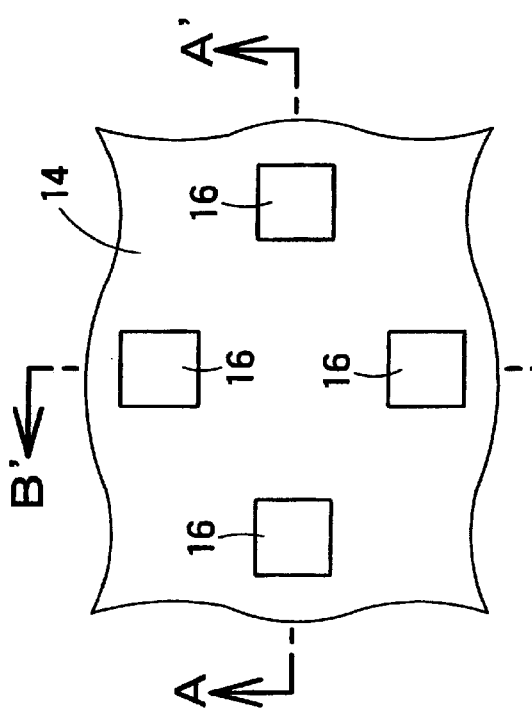
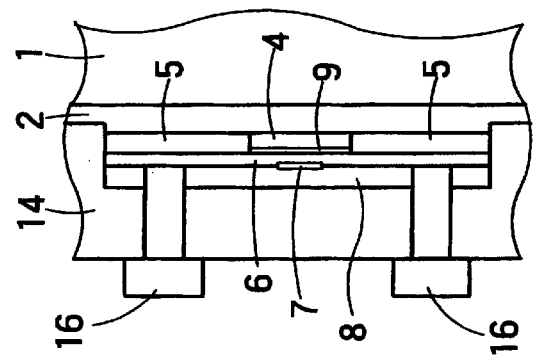
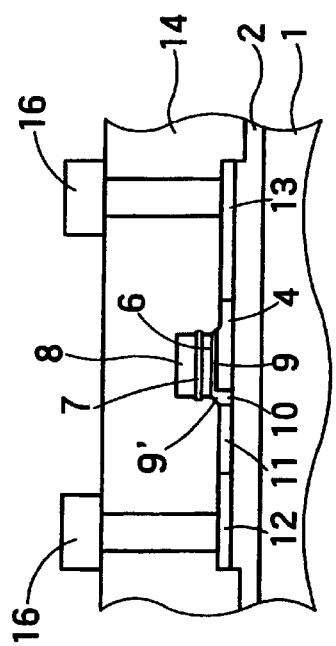
FIG. 2A
FIG. 2B
FIG. 2C

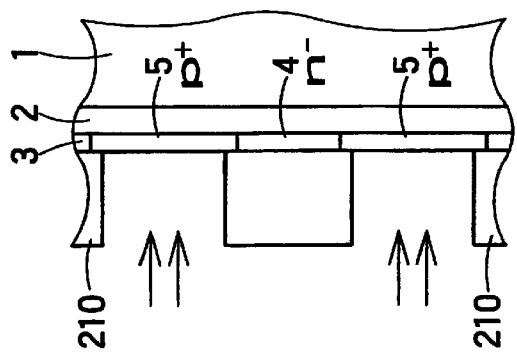
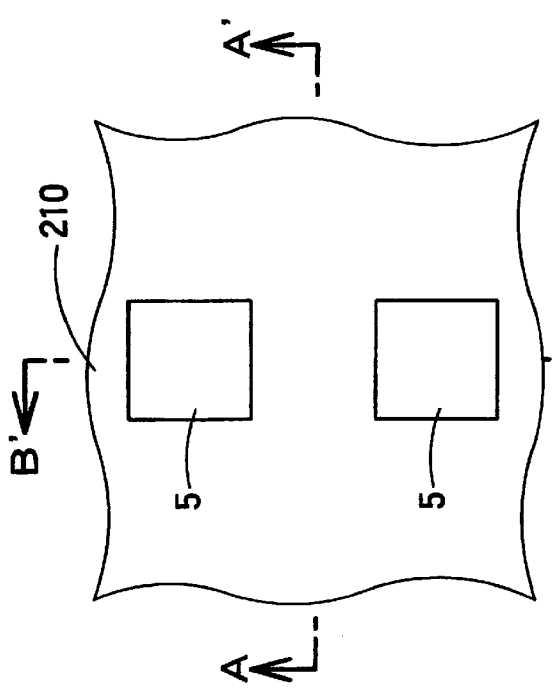
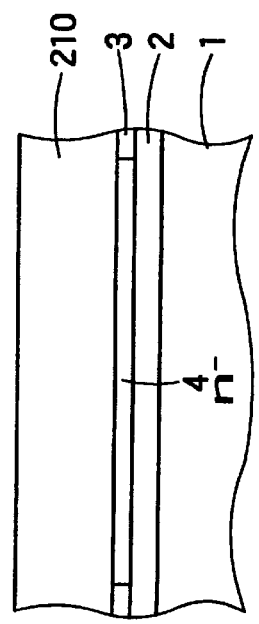

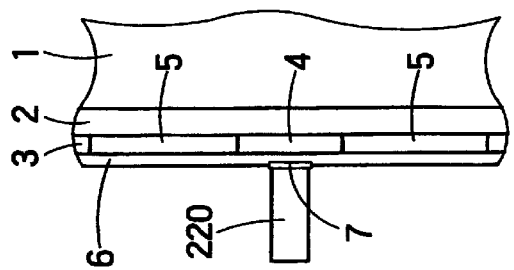
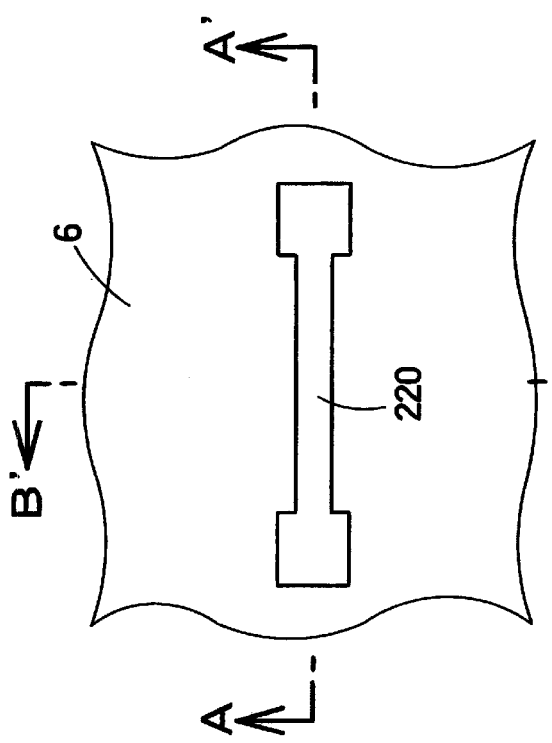
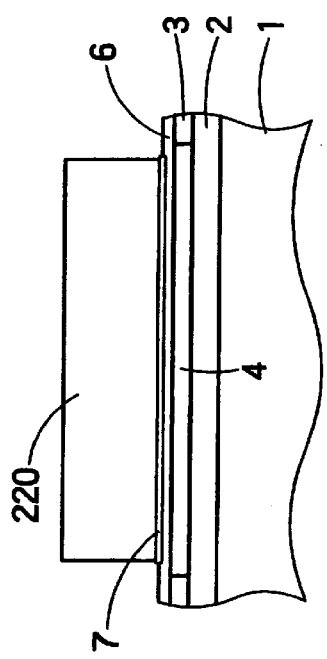

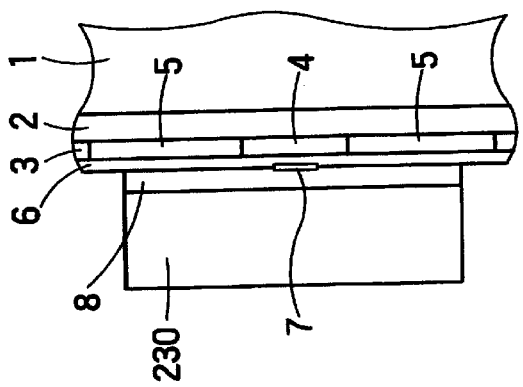
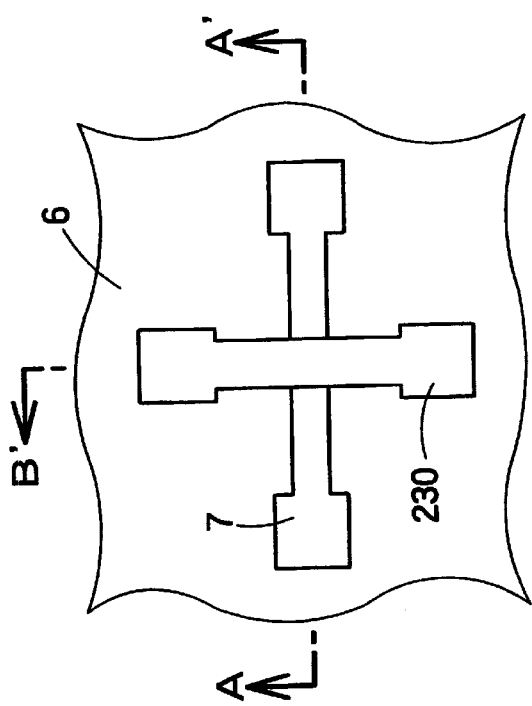
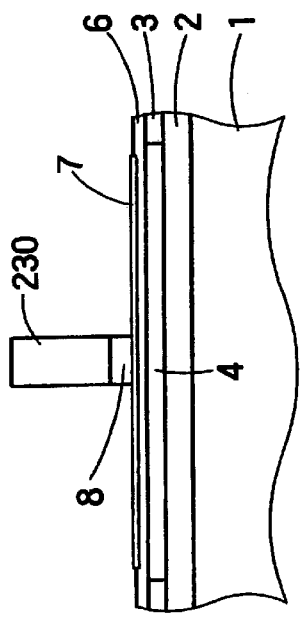
FIG. 7A
FIG. 7B
FIG. 7C

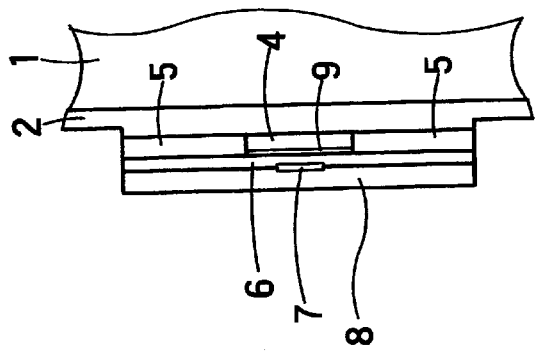
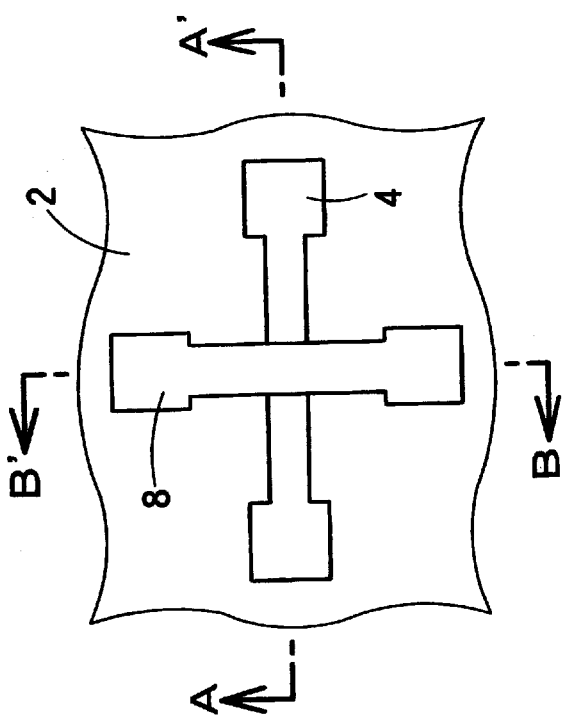
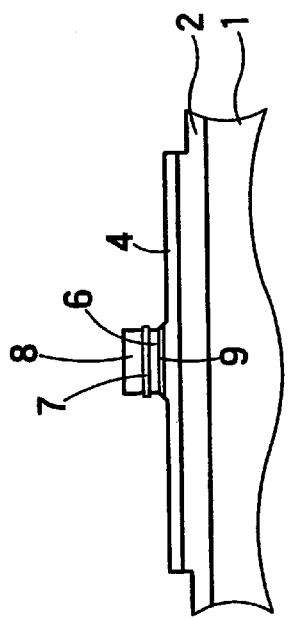
FIG. 9C
FIG. 9A
FIG. 9B

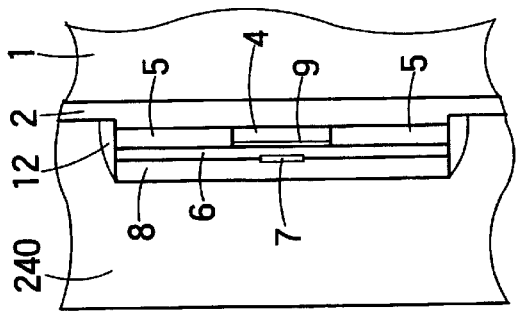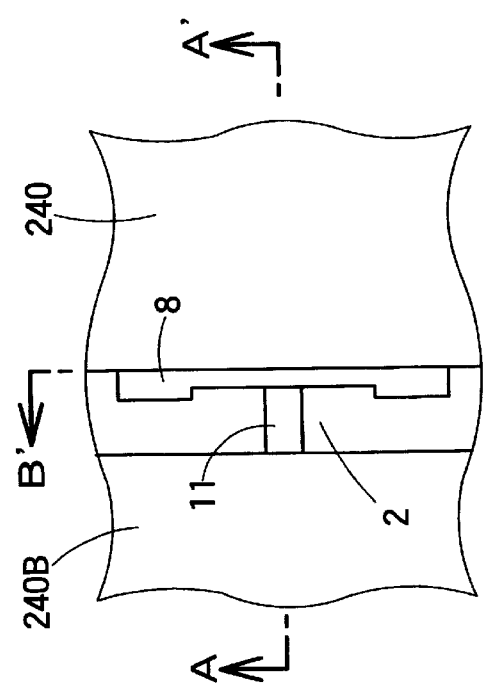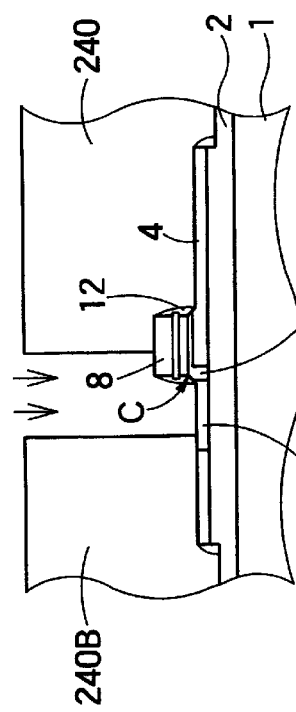

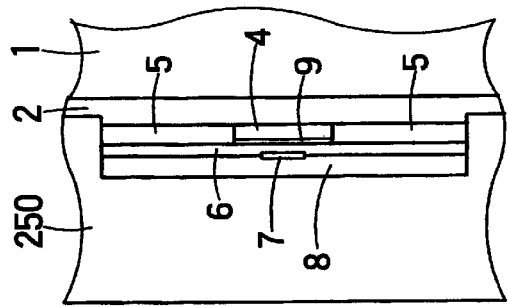
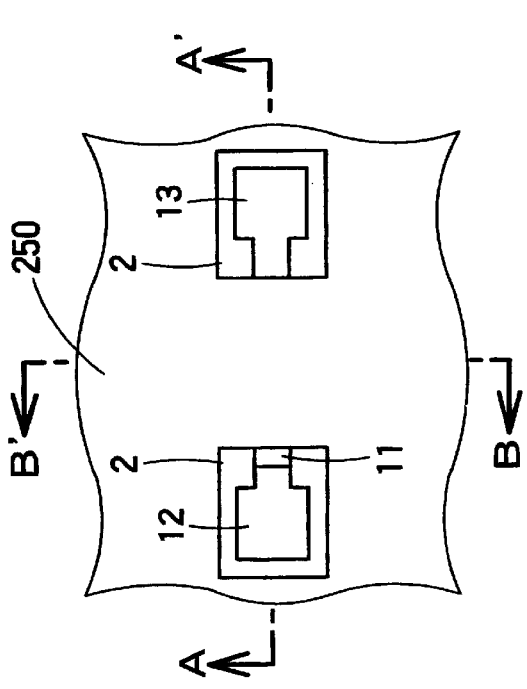
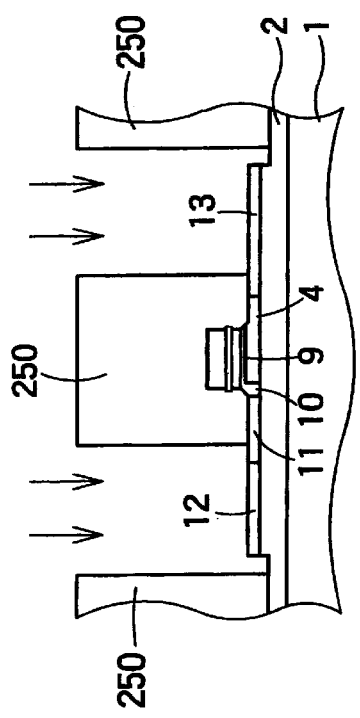

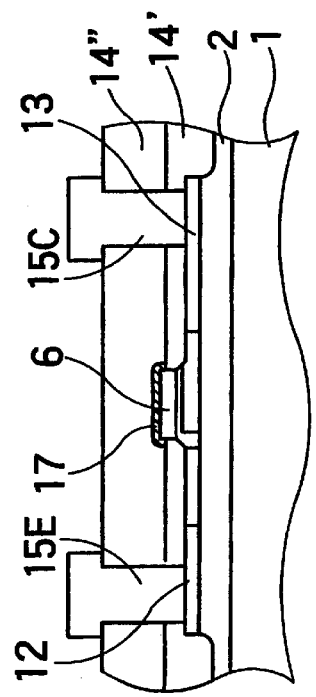
FIG. 12C
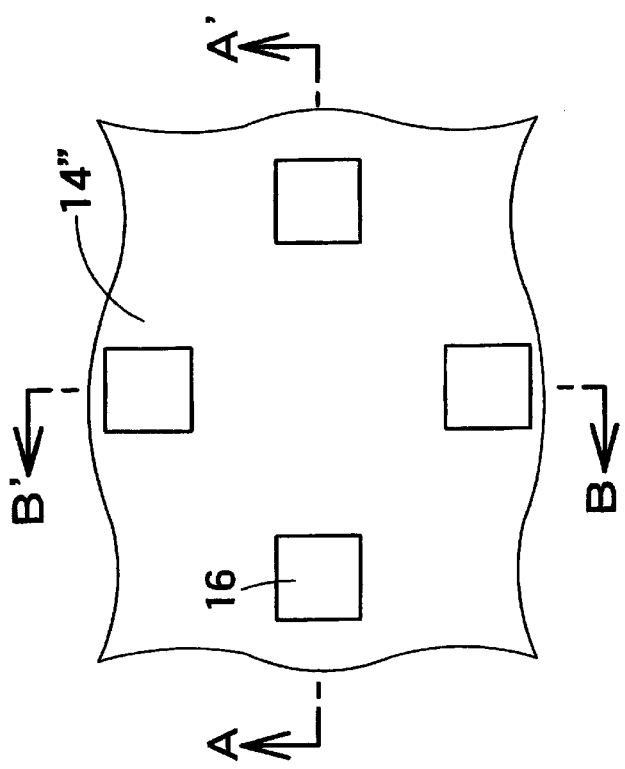
FIG. 12A
FIG. 12B

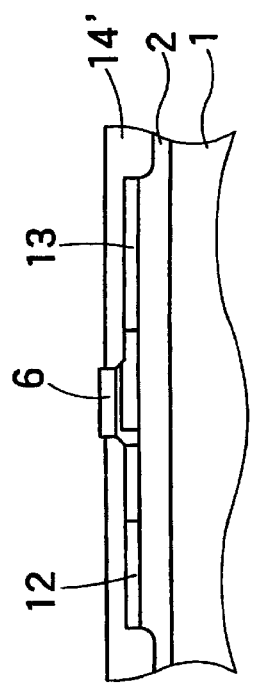
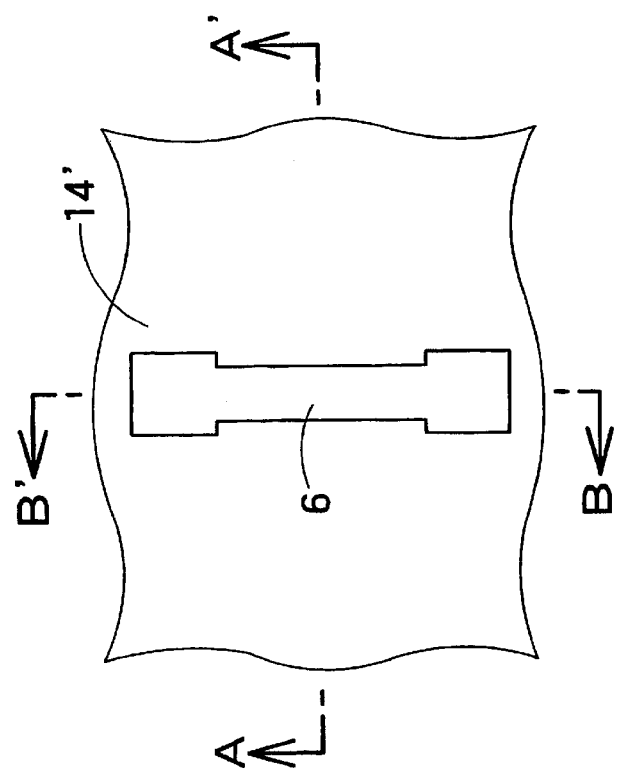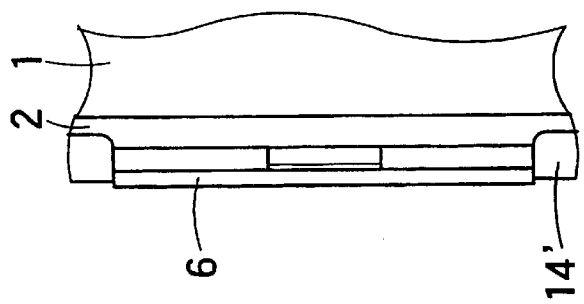

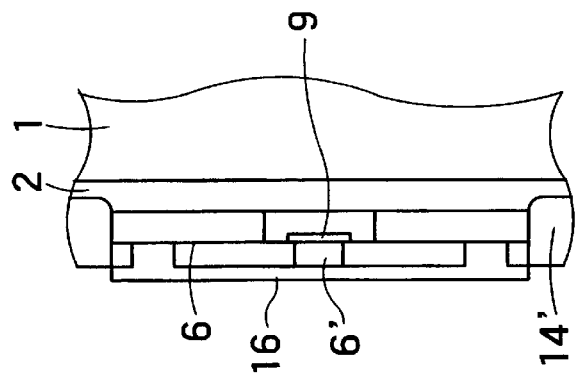
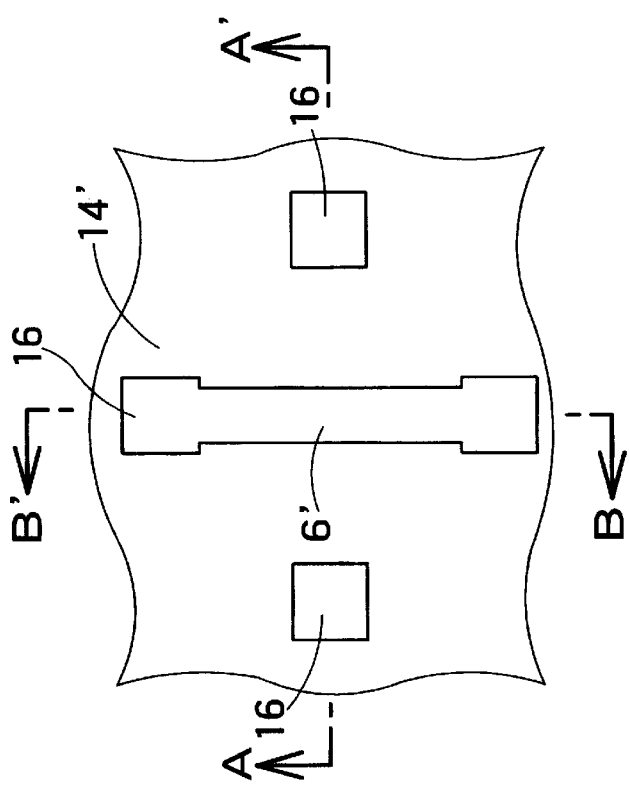
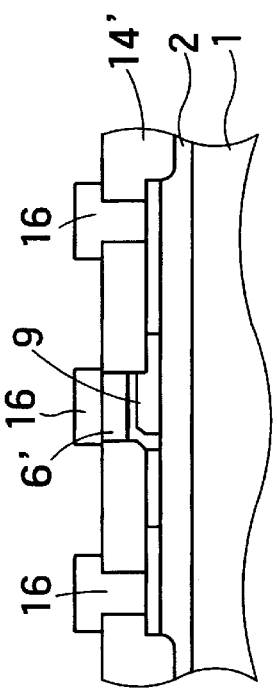

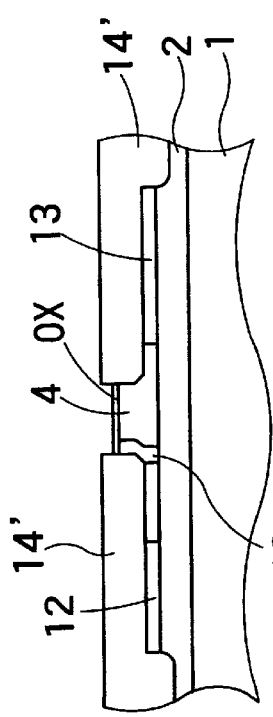
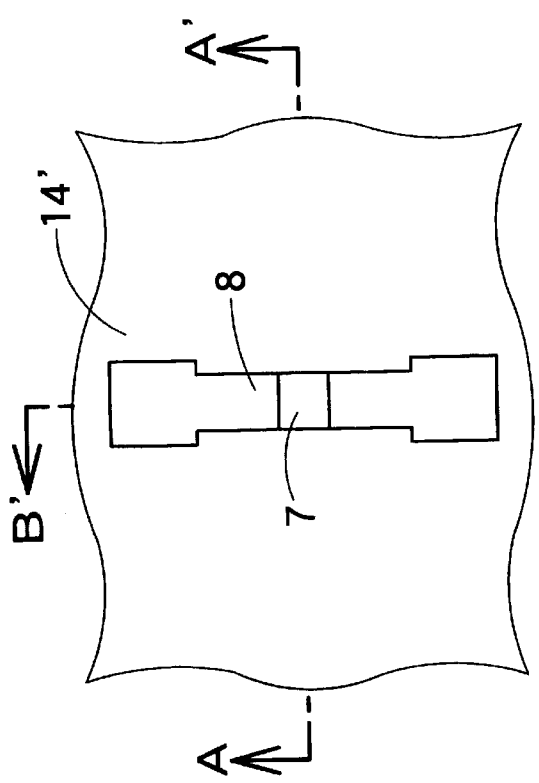
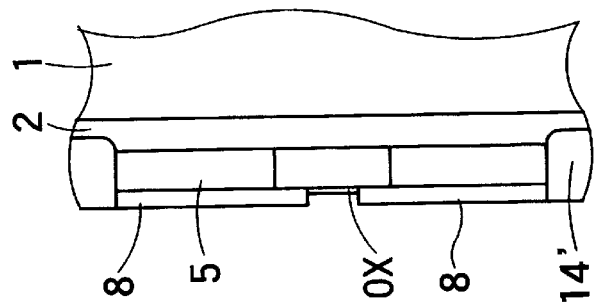

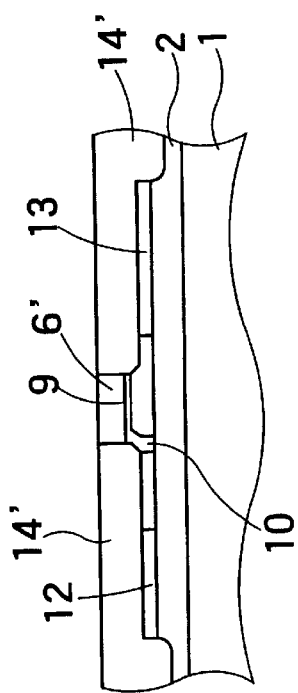
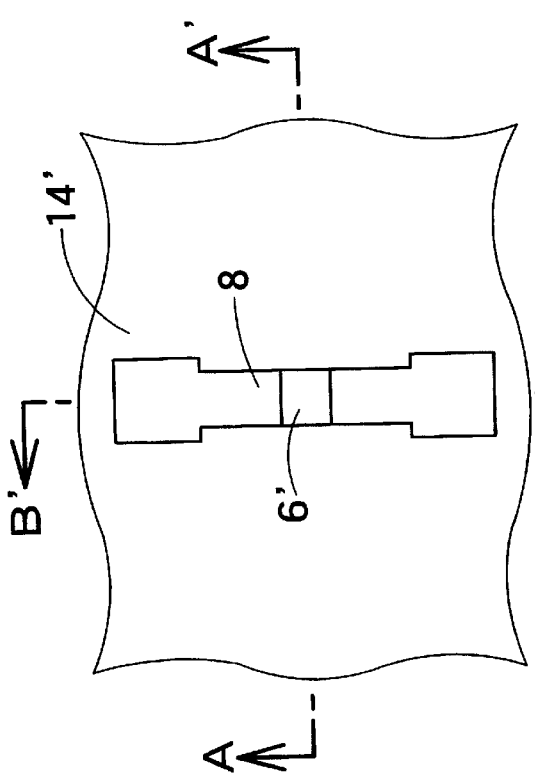
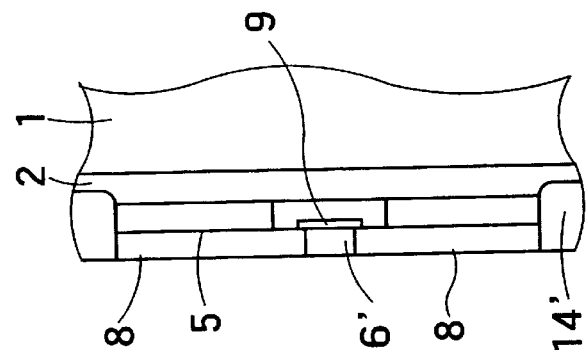

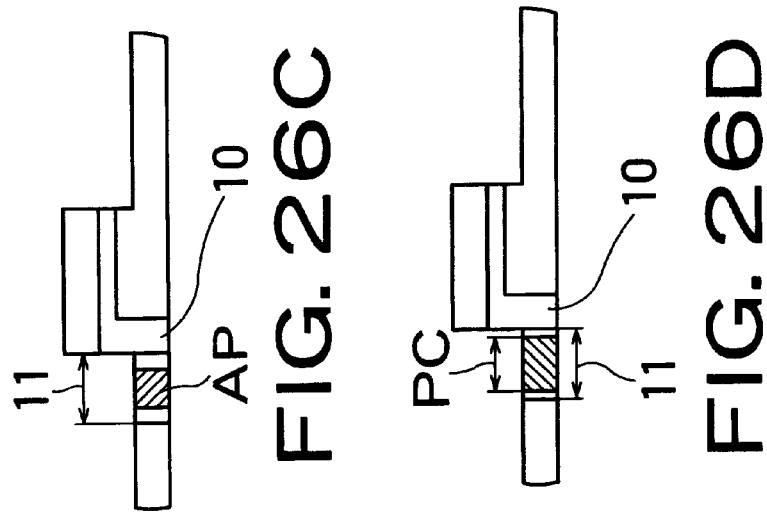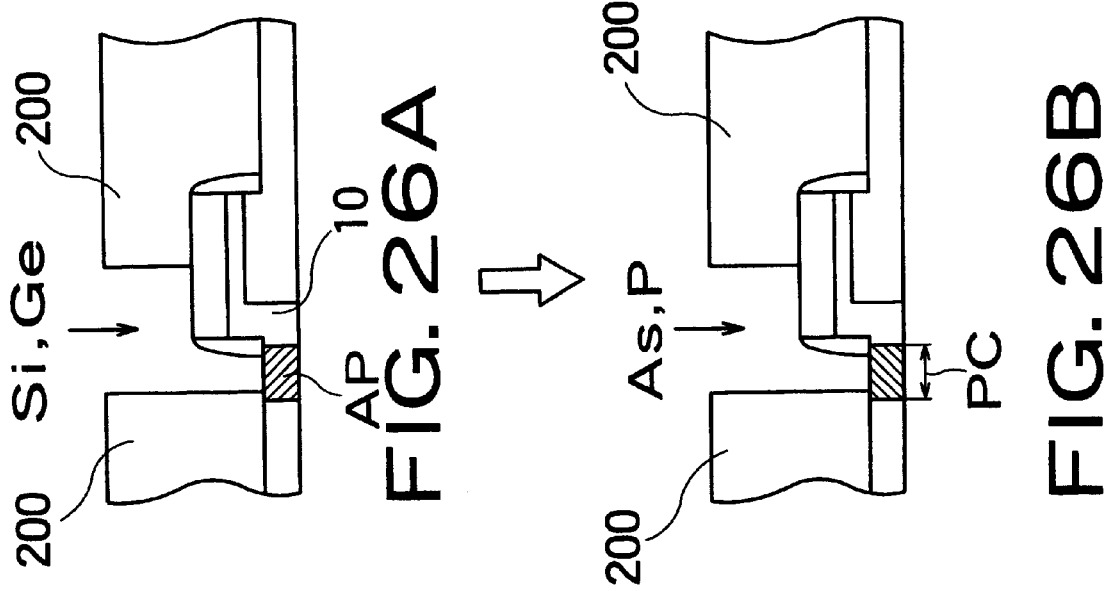

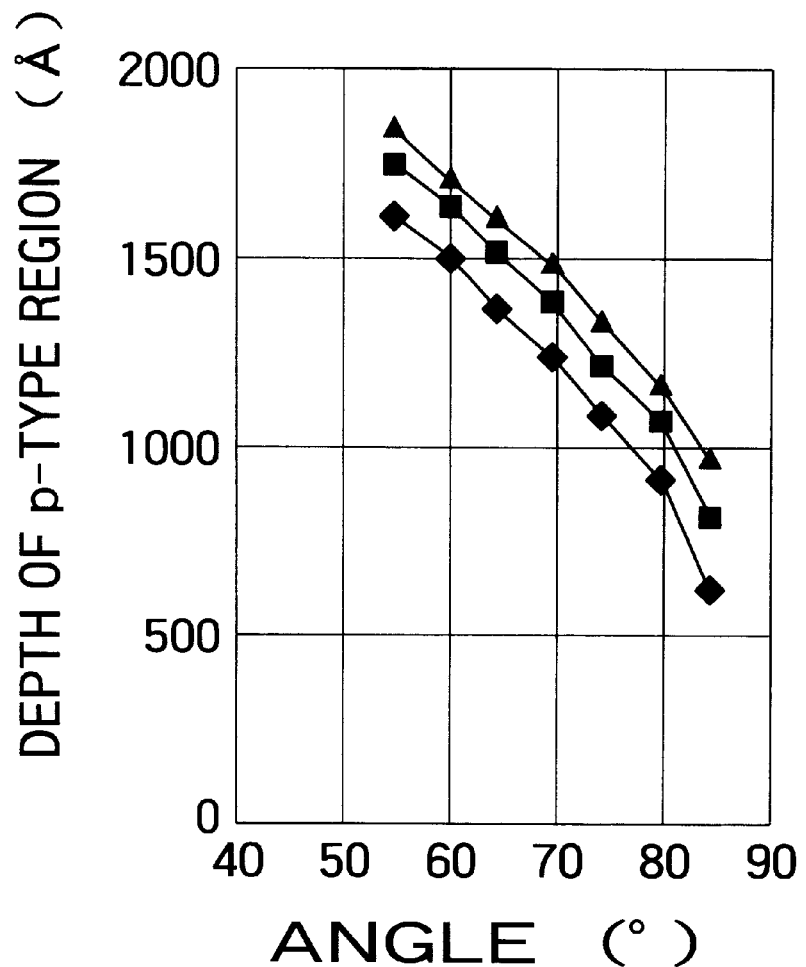
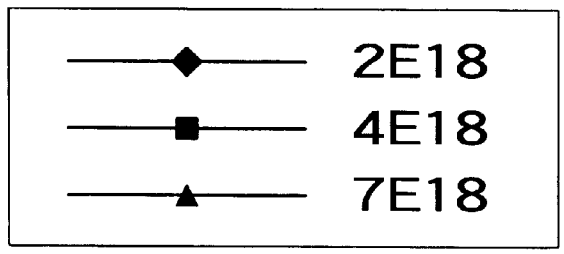
FIG. 43

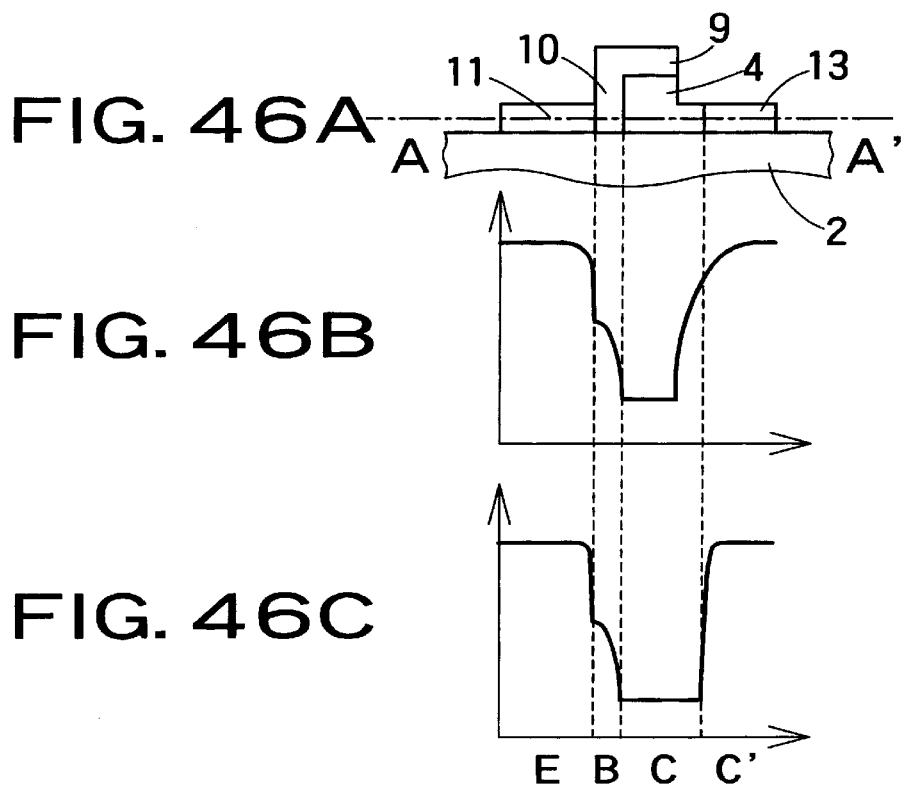
FIG. 46A
FIG. 46B
FIG. 46C
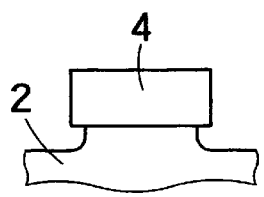 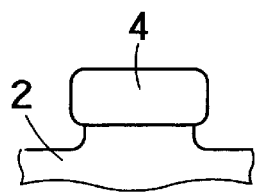 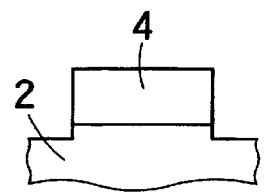
FIG. 47A　　FIG. 47B　　FIG. 47C

LATERAL BIPOLAR TRANSISTOR FORMED ON AN INSULATING LAYER

BACKGROUND OF THE INVENTION

Field of the Invention

This invention relates to a bipolar transistor and, more particularly, to a lateral bipolar semiconductor device made by using semiconductor thin films like SOI (silicon on insulator) layer on an insulating substrate.

Bipolar transistor (hereinafter called "BJT") made by using SOI layers are expected to be operative at a higher speed because of the lower floating capacitance as compared with transistors made on bulk silicon substrates. One of literatures disclosing such BJT is, for example, IEEE EDL-8, No. 3, p. 104, 1987 by J. C. Sturm, et al.

FIG. 49 is a schematic cross-sectional view showing construction of BJT. BJT shown here is formed on an insulating film 2 stacked on a silicon substrate 1. That is, made on the insulating film 2 are an n$^+$-type collector region 67, p-type intrinsic base region 63 and n$^+$-type emitter region 68 in a close alignment in this order. Made on the intrinsic base region 63 in self alignment is a p$^+$-type external base region 63$_2$ for ensuring contact with an electrode.

A manufacturing method of this structure is summarized below. First made on the insulating film 2 is an initial silicon layer having a thickness approximately reaching the surface of a p$^+$-type layer 63$_2$, and an impurity is doped into the entirety to the impurity concentration of the intrinsic base region 63. Then, its surface is doped into a p$^+$-type, and a thick insulating film is made in the region for the base region. Using this film as a mask, regions for the emitter and the collector are etched until removing the p$^+$-type layer. Still using the thick insulating film as a mask, an n-type impurity is doped into the emitter and collector regions by ion implantation.

In the structure shown in FIG. 49, even if the base contact is made on the external base region 63$_2$ at one end of the element located in a vertical direction relative to the drawing sheet, electric bias from the contact to the intrinsic base region 63 results in being first transferred through the external base region 63$_2$ having a relatively low resistance, and then being supplied from an upper direction to a lower direction. Therefore, by enlarging the intrinsic base region 63 and the external base region 63$_2$ in width and by elongating the device along a direction vertical to the drawing sheet, the cross-sectional area vertical to the flow direction of the base current in the intrinsic base region and the external base region can be increased, and the base resistance can be decreased. The decrease of the base resistance leads to improvement of noise figure (NF) and maximum oscillation frequency (f$_{max}$) which are important performance indices for use of BJT as an analog element, and BJT having low-noise high f$_{max}$ characteristics could be expected.

However, for use with high frequencies on the order of gigaherz, another performance index, the cut-off frequency (f$_T$), must be improved. Actually, as shown in the following equation, the value of f$_T$ is closely related with NF and f$_{max}$, and high f$_T$ is indispensable also for good NF and f$_{max}$.

$$f_{max} = \sqrt{\frac{f_T}{8\pi R_B C_{jc}}}$$

$$N_F = 1 + \frac{qI_c R_B}{kT}\left(\frac{f}{f_T}\right)^2\left[1 + \sqrt{1 + \frac{2kT}{qI_c R_B}\left(\frac{f_T}{f}\right)^2}\right]$$

where R$_B$ is the base resistance, C$_{jc}$ is the capacitance between the base and the collector, q is the elementary charge I$_c$ is the collector current, T is the absolute temperature, k is the Boltzmann constant, f is the frequency.

Therefore, in order to obtain high f$_T$ by reducing the carrier transit time in the base region, the width of the intrinsic base region 63 (distance from the emitter-side end to the collector-side end) must be reduced as small as 0.1 μm or less.

This width cannot be sufficiently reduced due to dimensional limitation of lithography process. Even if it could be reduced, since it compels the overlying p$^+$-type region to be narrowed, the base resistance of the external base region 63$_2$ increases, and sufficient NF and f$_{max}$ could not be obtained.

On the other hand, as a literature disclosing a structure for supplying a base bias from an upper portion, there is a report in IEDM Tech. Dig. p. 663 (1991) by G. G. Shahidi, et al.

FIG. 50 is a cross-sectional view schematically showing BJT using the structure. A feature of this BJT lies in using p-type polycrystalline silicon (polysilicon) 163 for extension of the electrode from the base p-type region 63 toward the upper portion, and connecting it to low-resistance p$^+$-type polysilicon 63$_2$. This p$^+$-type polysilicon 63$_2$ is separated from the n$^-$-type collector region by the insulating layer 169 and insulating side walls 168.

In this structure, since the intrinsic base and the external base are made independently to permit the external base to be made with a sufficient width even when the intrinsic base is narrowed, there is a possibility of overcoming the problem involved in the structure shown in FIG. 49.

In the structure of FIG. 50, however, since the lead-out portion 163 connecting the intrinsic base and the external base is made of a different material of polycrystalline silicon base and so on, for example, it results in having contact resistance between the intrinsic base and the lead-out layer and between the lead-out layer and the external base respectively. Furthermore, the lead-out portion is made of polycrystalline silicon with a higher specific resistance than single crystalline silicon with the same impurity concentration. Therefore, actual base resistance increases significantly. In order to decrease the base resistance, there is the need for some additional measures, such as further increasing the length in the direction vertical to the drawing sheet, connecting a plurality of BJTs in parallel, for example, and its results in increasing the area each element occupies and increasing power consumption.

At the contact between the intrinsic base and the lead-out portion, the device property is liable to deteriorate due to turbulence in impurity profile. More specifically, if the impurity concentration in the lead-out is increased higher than that of the intrinsic base for the purpose of reducing the contact resistances and the resistance of the lead-out portion itself, impurities diffuse from the high-concentrated lead-out portion to the intrinsic base, and invites an increase in base concentration near the interface and an increase in the base width. As a result, current gain factor (h$_{FE}$) and f$_T$ may decrease, and the junction with the high-concentrated emitter may deteriorate to permit tunneling junction leakage. In contrast, when the impurity concentration in the lead-out portion is lower than that of the intrinsic base, the base resistance increases, and impurities in the single-crystal silicon are rather absorbed out along the interface. Therefore, punch-through is liable to occur. Furthermore, since the depletion region extending from the emitter and collector to the base crosses over the lead-out portion along the contact interface, it may invites some additional problems, such as sudden increase in junction leakage, deterioration of the withstanding voltage, and so on.

To prevent these problems, it is necessary to set the width of the intrinsic base wider than that of the lead-out portion as illustrated in the drawing, and this inevitably invites a decrease of $f_T$. In contrast, if the intrinsic base is narrowed, the lead-out portion must be more narrowed, and it results in increasing the base lead-out resistance. Therefore, it has been very difficult to improve the total performance.

There is a possibility of overcoming some of the above-indicated problems by making the base lead-out portion as a single crystal silicon layer by selective epitaxial growth instead of polycrystalline silicon. In this case, however, there will remain the same problems as those with polysilicon, because crystal irregularities are inevitably produced especially at peripheral edges of the epitaxial film. Moreover, influences derived from changes in structure for using an epitaxial layer and thermal process for its growth, use of an epitaxial growth technique, and so on, invite an increase of the manufacturing cost.

As discussed above, any of conventional BJTs configured to extend the base upward involves the problems: namely, upon reducing the width of the intrinsic base, difficulty in lithographic processing, increase of the base resistance therewith, deterioration of property at the lead out portion of polycrystalline silicon, for example, and a satisfactory high property could not be obtained.

SUMMARY OF THE INVENTION

The present invention has been made taking account of those problems. It is therefore an object of the invention to provide a semiconductor device as a bipolar transistor capable to reduce the width of the intrinsic base width without increasing the base lead-out resistance to obtain a remarkably good high-frequency property.

According to the invention, there is provided a bipolar transistor comprising:

an insulating layer having a major surface;

an island of single crystal semiconductor material selectively formed on said major surface of the insulating layer, said island including a collector region of a first conduction type and an intrinsic base region of a second conduction type located adjacent to said collector region; and an emitter region of the first conduction type located adjacent to said intrinsic base region, said island further including an external base region of the second conduction type located on said intrinsic base region and having a higher impurity concentration than said intrinsic base region.

According to the invention, there is also provided a bipolar transistor comprising:

an insulating layer having a major surface;

an island of single crystal semiconductor material selectively formed on said major surface of the insulating layer, said island including a collector region of a first conduction type and an intrinsic base region of a second conduction type located adjacent to said collector region; and an emitter region of the first conduction type located adjacent to said intrinsic base region, said island further including a monolithic protrusion projecting vertically upward relative to said major surface of said insulating layer located on said intrinsic base region, said monolithic protrusion including an external base region of the second conduction type located near the uppermost layer thereof and having a higher impurity concentration than said intrinsic base region, said monolithic protrusion further including a base lead-out region of the second conduction type formed along a side surface thereof and connecting said intrinsic base region external base region.

According to the invention, there is also provided a bipolar transistor comprising:

an insulating layer having a major surface; and an island of semiconductor material selectively formed on said major surface of the insulating layer, and including a first collector region of a first conduction type, an emitter region of the first conduction type, an intrinsic base region of a second conduction type interposed between said collector region and said emitter region, which are closely located on said major surface of said insulating layer, said island of semiconductor material further including a monolithic protrusion which is obtained by first providing a portion for said collector region and said intrinsic base region in a semiconductor layer provided on said major surface of said insulating layer, and removing a selective part of said semiconductor layer to a certain thickness thereof excluding at least a portion for said collector region and at least a portion for said intrinsic base region, said monolithic protrusion further including an external base region made by introducing an impurity of said second conduction type from its upper surface, and said monolithic protrusion further including a base lead-out region of the second conduction type provided along a side surface thereof to connect said intrinsic base region with said external base region.

According to the invention, there is also provided a manufacturing method of a bipolar transistor including:

an insulating layer having a major surface; and an island of semiconductor material selectively formed on said major surface of the insulating layer, and including a first collector region of a first conduction type, an emitter region of the first conduction type, and an intrinsic base region of a second conduction type interposed between said collector region and said emitter region, which are closely located on said major surface of said insulating layer, comprising:

a first step of making a portion for said collector region and said intrinsic base region in a semiconductor layer provided on said major surface of said insulating layer;

a second step of making a monolithic protrusion by removing a selective part of said semiconductor layer to a certain thickness thereof excluding at least a portion for said collector region and at least a portion for said intrinsic base region;

a third step of making a base lead-out region of the second conduction type provided along a side surface of said monolithic protrusion to connect said intrinsic base region with said external base region;

a fourth step of making an external base region of the second conduction type near the uppermost layer of said monolithic protrusion by introducing an impurity of the second conduction type from an upper surface of said monolithic protrusion;

Components of the transistor from the intrinsic base to the lead-out region further to the external base region may be made as a monolithic (single crystal silicon layer to enable direct application of a base) bias from the external base the intrinsic base to without a contact. Thus, the problems of increase in base resistance and irregularities in crystal structure and impurity concentration profile can be removed.

The width of the external base region, which runs parallel to a line running between said emitter region and said collector region, is preferably larger than width of said intrinsic base region, which runs parallel to a line running between said emitter region and said collector region, so that a sufficiently low base resistance can be maintained even when the intrinsic base width is reduced.

The protrusion may be configured so that its side surfaces the collector region side approximately coincide with the head end of a depletion region which will extend during operation of the semiconductor device from the intrinsic base region into the collector region. Thus, the parasitic junction capacitance between the external base region and the collector region is suppressed to improve high-frequency characteristics such as $f_T$ and $f_{max}$ and reduce the power consumption.

The protrusion may be configured so that lower ends of its side surfaces approximately coincide with the head ends of a depletion region which will extend during operation of the semiconductor device from the external base region toward the insulating layer into the collector region. Thus, by reserving the path for the collector current while reducing the parasitic capacitance, the collector resistance is maintained low, and an increase of the collector current density is alleviated, to thereby prevent a decrease of $f_T$ caused by so-called Kirk effect.

The collector region preferably includes a first collector region located adjacent to the intrinsic base region and having a first impurity concentration, and an external collector region adjacent to the first collector region and having a second impurity concentration higher than the first impurty concentration, so that, when a depletion region extends from the external base region during operation of the semiconductor device, its head ends coincide with junctions between the first collector region and the external collector region. Thus, while the collector resistance is maintained low, the base expansion effect is suppressed, thereby to improve the high-frequency property and maintain a high withstanding voltage of base-collector junction.

In a more specific mode, the semiconductor device according to the invention includes an external base region of the second conduction type having an impurity concentration around $1E18$ cm$^{-3}$ and a region adjacent to the external base region having an impurity concentration of the fist conduction type as high as approximately $1E17$ cm$^{-3}$, and includes a region having an impurity concentration of the first conduction type as high as approximately $1E18$ to $1E19$ cm$^{-3}$ in a location of the collector region where the current density becomes high.

Alternatively, the semiconductor device according to the invention may include a region having an impurity concentration of the first conduction type lower than the impurity concentration of the collector region in a location nearer to the base region, so that an electric bias of the support substrate be applied to induce majority carriers of the first conduction type in the collector region.

Furthermore, the semiconductor device according to the invention may include a buffer layer of polycrystalline silicon, for example, stacked on the protrusion to introduce impurities of the second conduction type through the buffer layer and thereby form the external base region. Thus, an impurity profile not extending so far into the silicon layer and having a steep gradient can be realized, and a high-concentrated, low-resistance external base region can be obtained while maintaining the collector region even when the silicon layer is initially thin.

The invention having the above-explained modes of use promises the effects explained below.

According to the invention, the p-type intrinsic base region and the n$^-$-type collector region forming the "transverse arm portions" are configured to project upward from the substrate surface to form a protrusion, and the width P of the protrusion is wider than the width W of the intrinsic base region. Therefore, an excellent high-frequency property can be realized by reducing the base resistance while reducing the base width W.

Additionally, according to the invention, by making a buffer layer containing a p-type impurity on the protrusion and making the p$^+$-type external base region by diffusion from the buffer layer, a shallow and very steep profile can be made with no tail-draggling in the SOI silicon layer, and the lead-out length of the external base region upward from the intrinsic base region can be shortened. Accordingly, the base resistance is remarkably reduced, the collector region is reliably reserved even when the SOI layer is reduced in thickness, and increase in collector resistance and occurrence of Kirk effect can be prevented.

Moreover, according to the invention, by configuring the protrusion so that its collector-side side surface approximately coincide with the head end of a deletion layer which will extend from the intrinsic base region to the collector region, parasitic capacitance between the base and collector can be minimized.

Furthermore, according to the invention, by making the effective distance of the current path between the p$^+$-type region and the external collector region longer than the current path between the intrinsic base region and the external collector region to prevent degradation of breakdown voltage caused by the current path between the p$^+$-type region and the external collector region, BJT excellent in high-frequency property can be realized, in which the base resistance is decreased without inviting degradation of the resistance voltage between the base and the collector.

According to the invention, by appropriately adjusting the configuration of the protrusion relative to the head end of the depletion region which extends from the external base region to the collector region during operation of BJT, the problem of the depletion region extending too far and blocking the path for the collector current is removed, to thereby reliably reserve the path of the collector current and prevent increase of the element resistance.

Further, according to the invention, by appropriately making a low-concentrated region in the collector region, it is possible to reduce the collector resistance without degrading the breakdown voltage of the collector and to prevent the base expansion effect. Thus, wider ranges of operation voltage and operation current are ensured, and high-frequency property is remarkably improved.

Moreover, according to the invention, when a so-called Corbino-type flat pattern is employed, no p-n junction is formed on the processed end surfaces of the element region. Therefore, breakdown voltage of the junction is improved, and leakage at the junction is suppressed. In contrast, by maintaining the processed end surfaces of the element region damaged, these portions can be used as a gettering site of contaminants like heavy metals, and the production yield of elements and their reliability can be improved.

As summarized above, the invention provides a semiconductor device having a good frequency property, high yield and high reliability while maintaining the base resistance sufficiently low, and its industrial merit is great.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings:

FIG. 2A is a plan view schematically showing a central part of a first example of the semiconductor device according to the invention;

FIG. 2B is a cross-sectional view taken along the A–A' line of FIG. 2A;

FIG. 2C is a cross-sectional view taken along the B–B' line of FIG. 2A;

FIGS. 5A through 5C are diagrams showing a central part of BJT shown in FIGS. 2A through 2C under a manufacturing process, for explaining its manufacturing method;

FIGS. 6A through 6C are diagrams showing a central part of BJT shown in FIGS. 2A through 2C under a manufacturing process, for explaining its manufacturing method;

FIGS. 7A through 7C are diagrams showing a central part of BJT shown in FIGS. 2A through 2C under a manufacturing process, for explaining its manufacturing method;

FIGS. 9A through 9C are diagrams showing a central part of BJT shown in FIGS. 2A through 2C under a manufacturing process, for explaining its manufacturing method;

FIGS. 10A through 10C are diagrams showing a central part of BJT shown in FIGS. 2A through 2C under a manufacturing process, for explaining its manufacturing method;

FIGS. 11A through 11C are diagrams showing a central part of BJT shown in FIGS. 2A through 2C under a manufacturing process, for explaining its manufacturing method;

FIG. 12A is a plan view schematically showing a central part of BJT taken as an example of the invention;

FIG. 12B is a cross-sectional view taken along the A–A' line of FIG. 12A;

FIG. 12C is a cross-sectional view taken along the B–B' line of FIG. 12A;

FIGS. 13A through 13C are diagrams showing BJT of FIGS. 12A through 12C under a manufacturing process;

FIGS. 20A through 20C are diagrams of an example of BJT made by using a silicon nitride film used as a first mask material also as a stopper of CMP;

FIGS. 22A through 22C are diagrams showing a manufacturing process in which the first mask material 7, namely, nitride film, has been removed;

FIGS. 23A through 23C are diagrams showing a manufacturing process in which boron-doped polycrystalline silicon has been selectively formed on a protrusion as a second buffer layer 6';

FIGS. 26A through 26D are diagrams schematically showing a modified manufacturing method of BJT according to the invention;

FIGS. 34 through 36F are diagrams for explaining examples of BJT according to the invention, in which FIG. 34 is a cross-sectional view, FIG. 35 shows flows of a current, FIGS. 36A through 36F show its central part under different steps of a manufacturing process, and all correspond to A–A' cross-sectional views of FIG. 1;

FIG. 43 is a graph showing a result of simulation to review relationship between the angle of a side surface of a protrusion relative to a substrate surface and the depth of a p-type region made on the side surface of the protrusion in which thickness of silicon of the emitter portion is approximately 0.1 $\mu$m when ions are implanted under three different conditions making $2E18\ cm^{-3}$, $4E18\ cm^{-3}$ and $7E18\ cm^{-3}$ as the base concentration;

FIGS. 44A through 45B are diagrams showing central parts of examples of BJT according to the invention, in which FIGS. 44A and 45A show patterns viewed through their top planes, and FIGS. 44B and 45B are their A–A' cross-sectional views;

FIGS. 46A through 46C are schematic diagrams for explaining an example of BJT according to the invention, in which FIG. 46A is a cross-sectional view corresponding to the A–A' cross-sectional view of FIG. 1; FIG. 46B shows an impurity concentration profile viewed from the A–A' direction; and FIG. 46C shows an impurity concentration profile in a comparative example;

FIGS. 47A through 47C are schematic diagrams for explaining an example of the invention, which are cross-sectional views of a "transverse arm portion" from the B–B' direction of FIG. 1;

DETAILED DESCRIPTION OF THE PREFERRED EMBODIMENTS

Figure 1:
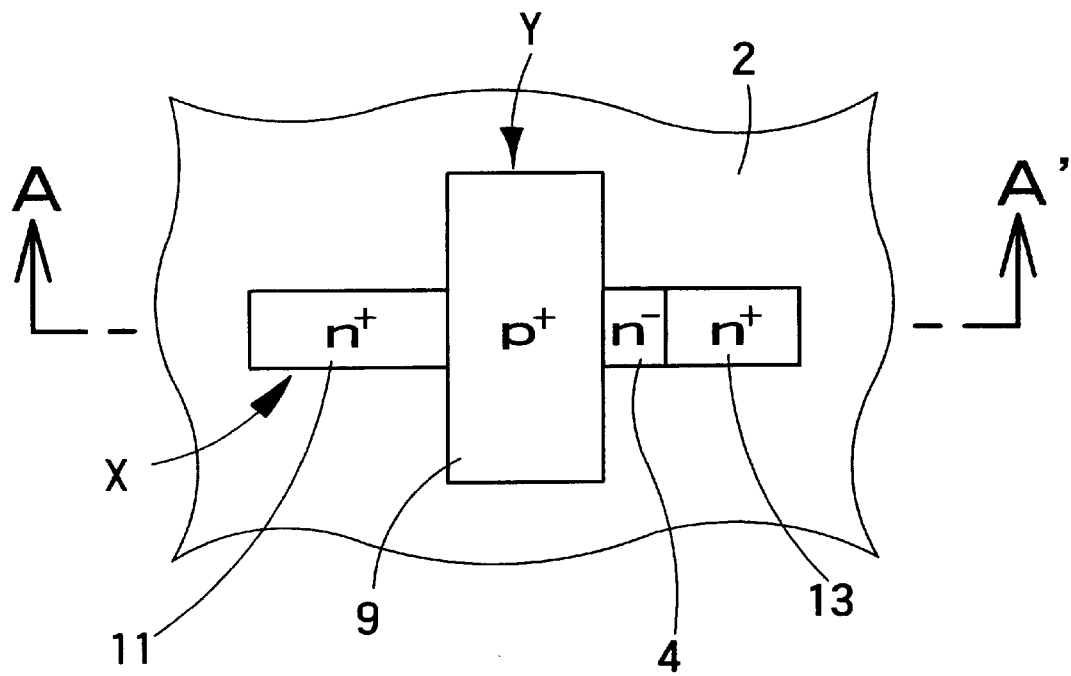
FIG. 1A is a plan view schematically showing a basic central part of a semiconductor device according to the invention.
FIG. 1B is a cross-sectional view taken along the A–A' line of FIG. 1A.
Figure 1:
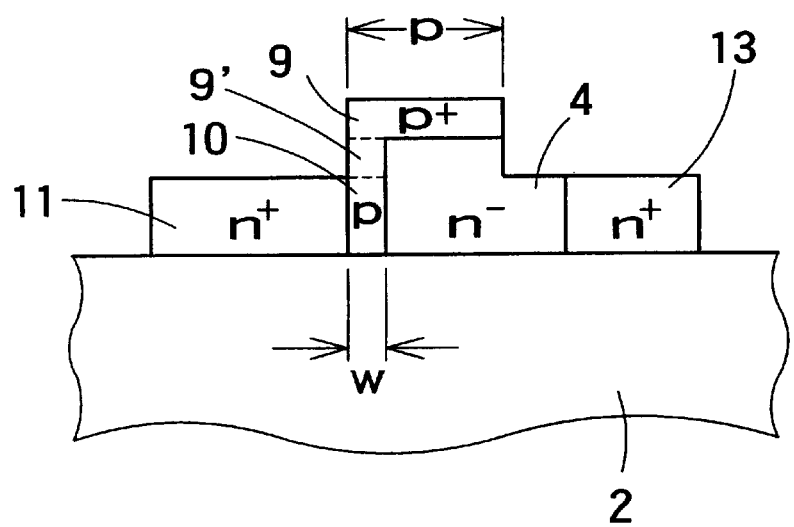

Referring now to the drawings, wherein like reference numerals designate identical or corresponding parts throughout the several views, and more particularly to FIGS. 1–48 thereof, there are illustrated various exemplary embodiments of the present invention.

FIGS. 1A and 1B are schematic diagrams showing a basic central structure of a semiconductor device according to the invention. FIG. 1A is a plan view, and FIG. 1B is a cross-sectional view taken along the A–A' line of FIG. 1A. As a plan-view pattern of BJT in the present invention, there is a cross-shaped pattern as shown in FIG. 1A. In this structure, on a substrate such as SOI substrate having formed an insulating film made of $SiO_2$, for example, at least as a lower layer, SOI layers of a "transverse arm portion X" and a "longitudinal arm portion Y" cross with each other. More specifically, there are provided the "transverse arm portion X" in which an $n^+$-type emitter region 11, a p-type intrinsic base region 10, $n^-$-type collector region 4 and $n^+$-type external collector region 13 are closely aligned in this order, and the "longitudinal arm portion Y" in which a $p^+$-type external base region 9 is formed. The p-type intrinsic base region 10 and the $p^+$-type external base region 9 are connected by a p-type base lead-out region 9'. The p-type intrinsic base region 10, $n^-$-type collector region 4 and $n^+$-type external collector region 13 forms the monolithic single-crystalline semiconductor island. The emitter region 11 may be the part of the single-crystalline island. Alternatively, the emitter region 11 may be formed of a polycrystalline semiconductor material.

A feature of BJT shown in FIGS. 1A and 1B lies in having a protrusion in which the p-type intrinsic base region 10 and the $n^-$-type collector region 4 forming the "transverse arm portion X" project upward of the substrate surface. Another feature lies in that the width P of the protrusion is wider than the width W of the intrinsic base region 10. As explained later, these features contribute to reducing the base resistance while decreasing the base width W to thereby realize excellent high-frequency property and low-noise property. In FIGS. 1A and 1B, the $p^+$-type region 9 extends over the entire width of the protrusion. However, its width may be narrower than the width P of the protrusion as far as the base resistance is not adversely affected. The width of the protrusion is determined exclusively by the minimum width a lithography can make, or determined by accuracy of lithography for making a resist mask on the protrusion upon ion implantation into a thin film region on one side of the protrusion to make the emitter region 11 and the base region 10 in a later process.

The structure shown in FIG. 1 is the basic structure of the semiconductor device according to the invention. Next explained are examples of the semiconductor device according to the invention from the viewpoint of its structure.

FIGS. 2A through 2C are diagrams schematically showing a first example of the semiconductor device according to the invention. FIG. 2A is a plan view showing a plan-view pattern of its central part, FIG. 2B is a cross-sectional view taken along A–A' line of FIG. 2A, and FIG. 2C is a cross-sectional view taken along the B–B' line of FIG. 2A.

BJT according to this example is also made on a buried oxide film 2 stacked on the semiconductor substrate 1. With reference to FIG. 2B, its structure is roughly explained below. On the buried oxide film 2, the $n^+$-type external emitter region 12, $n^+$-type emitter region 11, intrinsic base region 10, collector region 4 and external collector region 13 are made in close alignment in this order. Additionally, a protrusion is made, and $p^+$-type external base region 9 is formed its top end. The external base region 9 and the intrinsic base region 10 are connected by the p-type base lead-out region 9' formed along a side surface of the protrusion. On the external base region 9, the buffer layer 6, first mask material 7 and second mask material 8 are stacked in this order.

On the other hand, as shown in FIG. 2C, the base region is connected to an electrode via the $p^+$-type external base region 5.

Additionally, the entirety is protected by an inter-layer insulating film 14, and predetermined wirings 16 are provided.

A feature of the example shown here lies in making the buffer layer 6 containing a p-type impurity on the protrusion on the SOI layer of the "transverse arm portion" and making the p$^+$-type external base region 9 by diffusion from the buffer layer. Usable as the buffer layer are semiconductors such as amorphous silicon or epitaxally grown single crystal silicon, silicides or metals, or insulating films of BSG (boron silicate glass), or their complex films. A silicide or a metal particularly contributes to decreasing the resistance of the external base.

Next explained below is a case where polysilicon is used. For making the p$^+$-type external base region 9, a method can be used, in which boron (B) is ion-implanted into polysilicon, and it is diffused into a predetermined depth by later annealing. By using polysilicon, a p$^+$-type region shallow in the depth direction and high in concentration can be made.

Figure 3A:
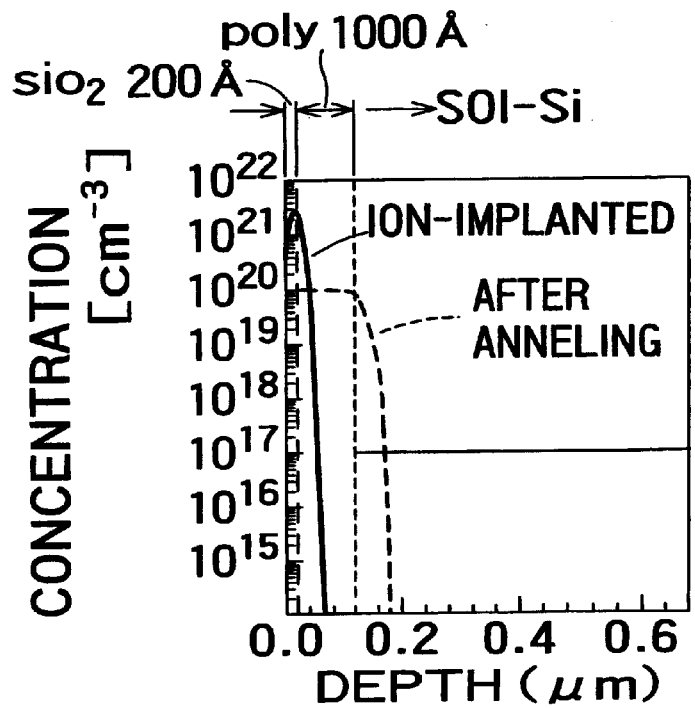
FIG. 3A is a graph showing an impurity concentration profile in the depth direction.
Figure 3B:
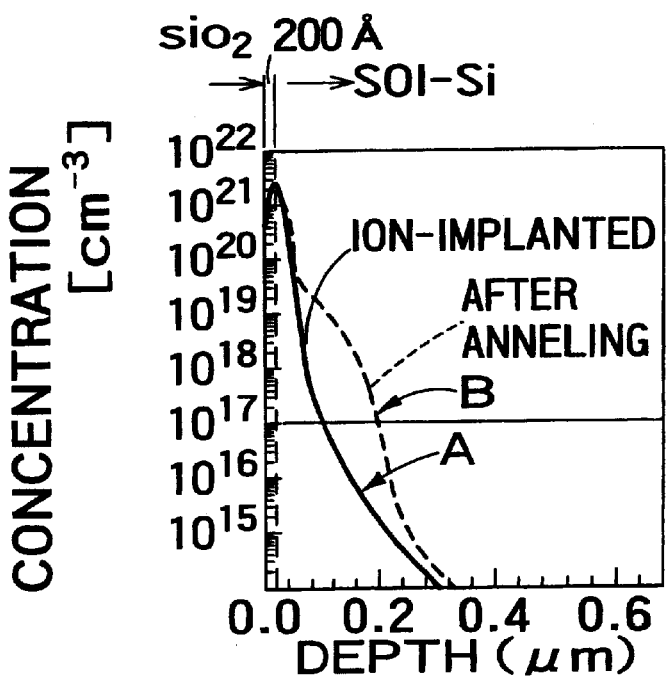
FIG. 3B is a graph showing an impurity concentration profile in the depth direction.

FIGS. 3A and 3B are graphs each showing an impurity concentration profile in the depth direction. FIG. 3A shows profiles immediately after ion implantation and after diffusion, respectively, in a structure made by stacking the buffer layer of 100 nm thick polysilicon on the SOI layer of silicon, BF$_2^+$ is ion-implanted through a 20 nm thick oxide film under the conditions holding the acceleration voltage in 15 keV and the dose amount in 5E15 cm$^{-2}$, and it is diffused by annealing at 800° C. for 60 minutes. FIG. 3B shows profiles in a structure prepared for the comparison purposes by ion implantation and diffusion into the SOI silicon layer via a 20 nm thick oxide film without making the polysilicon buffer layer.

With reference to FIG. 3A, when the polysilicon buffer layer is not made, just after ion implantation, there already appears a so-called "tail-draggling" (arrow A in FIG. 3B) which is a phenomenon in which the bottom portion of the boron profile extends with a moderate inclination. This is caused by the phenomenon called "channeling" in which part of injected ions is implanted deep into the crystal without colliding with crystal atoms. This is liable to occur in single crystal Si with a regular alignment of the crystal lattices. Taking account of the collector concentration being approximately 1E17 cm$^{-3}$, influence of the "tail-dragging" may appear to be small. However, it becomes as large as approximately 0.2 $\mu$m due to diffusion after annealing (arrow B in FIG. 3B). Thus, without the buffer layer, it is necessary to increase the thickness of the external base region not to adversely affect the underlying intrinsic base region and collector region. In the portion of the "tail-draggling", boron concentration is not sufficiently high, and resistance is relatively high. As a result, resistance of the external base region cannot be reduced sufficiently.

In contrast, with the polysilicon buffer layer, the "tail-draggling" is removed, and a very steep profile is realized as noted from FIG. 3A. Additionally, uniform and high concentration is maintained in the polysilicon buffer layer whereas a shallow, very steep profile with no "tail-draggling" is made in the SOI silicon layer.

Therefore, it is possible to decrease the lead-out length of the external base region upward from the intrinsic base region and to reduce the base resistance.

Additionally, since the absolute diffusion distance into the silicon layer can be limited, the collector region can be reliably reserved even when the SOI film is thinned, and increase in collector resistance and Kirk effect can be prevented.

The buffer layer, first mask material and second mask material 8 may be removed in an appropriate stage of the manufacturing process.

Next explained is a manufacturing method of BJT shown in FIGS. 2A through 2C.

FIGS. 4A through 12C are schematic diagrams of a central part of BJT shown in FIGS. 2A through 2C for explaining its manufacturing process.

Figures with numbers accompanied by "A" are plan views, those with numbers accompanied by "B" are cross-sectional views taken along A–A' lines in the plan views, and those with numbers accompanied by "C" are cross-sectional views taken along B–B' lines in the plan views.

Figure 4C:
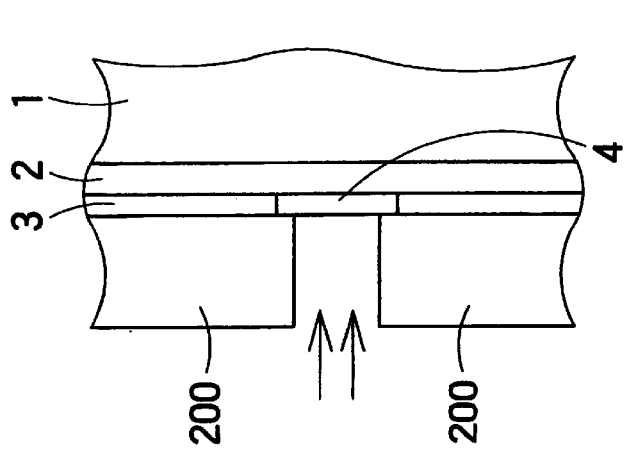
FIG. 4C is a cross-sectional view taken along the B–B' line of FIG. 4A.
Figure 4A:
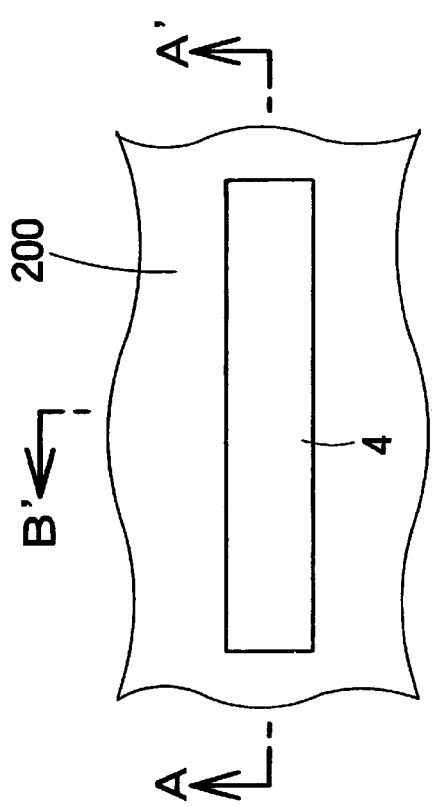
FIG. 4A is a plan view schematically showing a central part of BJT shown in FIGS. 2A through 2C under a manufacturing process, for explaining its manufacturing method.
Figure 4B:
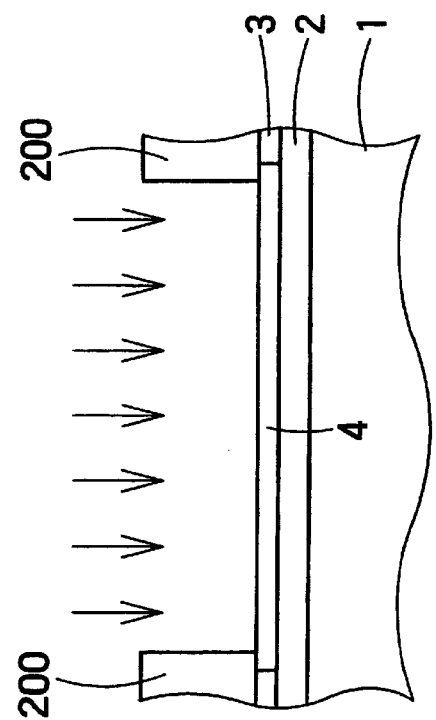
FIG. 4B is a cross-sectional view taken along the A–A' line of FIG. 4A.

When manufacturing BJT according to the invention, the n$^-$-type collector region is first made as shown in FIGS. 4A through 4C. More specifically, on one surface of a SOI wafer prepared by stacking a semiconductor layer 1, buried oxide film 2 (with a thickness of 100 nm to 400 nm or more) and SOI layer 3 (with a thickness of 150 nm to 300 nm, approximately), a thin SiO$_2$ film is made, if necessary, and a mask 200 of a resist, for example, is made. Then, an n-type impurity such as phosphorus (P) or arsenic (As) is ion-implanted through an opening in the mask 200 to locally change the SOI silicon layer 3 into the n$^-$-type collector region with a uniform concentration.

In FIGS. 4A through 4C, the impurity is selectively injected only into the portion finally changed to the n$^-$-type collector region 4. However, impurity concentration in this region is approximately 1E17 cm$^{-3}$ and far low than those of the base region and the emitter region. Therefore, ions may be injected throughout the entire surface of the SOI layer 3. Further, the n$^-$-type collector region 4 need not be uniform in concentration, but may be adjusted in concentration appropriately.

Next referring to FIGS. 5a through 5C, fringe region 5 are made. More specifically, a mask 210 having a predetermined opening pattern is formed on the SOI layer 3, and through ion implantation of boron (B) and annealing, a p-type diffusion layer extending to the buried oxide film 2 is formed. Its purpose lies in canceling the depletion region capacitance between an upper p$^+$-type region, which will be made in a later process in the "longitudinal arm portion", and the lower n$^-$-type collector region 4. In this case, however, since a junction between the p$^+$-type region 5 and the n$^-$-type collector region 4 is formed along side surfaces of the fringe regions, the fringe region had better not be made to decrease the capacitance in certain cases, depending upon their dimensional relation, and the fringe region 5 is not indispensable.

Next referring to FIGS. 6A through 6C, after the polysilicon layer 6 is stacked as the buffer layer, boron (B) is doped by ion implantation. Thereafter, the fist mask material 7, for regulating the shape of the "transverse arm portion" in a later step, is stacked on the polysilicon layer 6, and etched after selectively covering it with a resist mask 220, to thereby process it into the pattern of the "transverse arm portion". Usable as the first mask material 7 is a multi-layered film of a 20 nm thick oxide film by CVD and a 30 nm thick nitride film stacked thereon by CVD, for example.

Next referring to FIGS. 7A through 7C, the second mask material 8 for regulating the shape of the "longitudinal arm portion" in a later step is stacked, and it is etched by RIE (reactive ion etching) using a resist mask 230 to thereby process it into the pattern of the "longitudinal arm portion". When a 300 nm thick oxide film by CVD, for example, is used as the second mask material 8, the nitride film as the first mask material can be used also as an etching stopper.

Figure 8C:
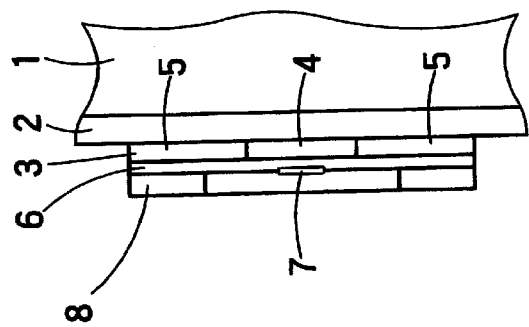
FIGS. 8A through 8C are diagrams showing a central part of BJT shown in FIGS. 2A through 2C under a manufacturing process, for explaining its manufacturing method.
Figure 8A:
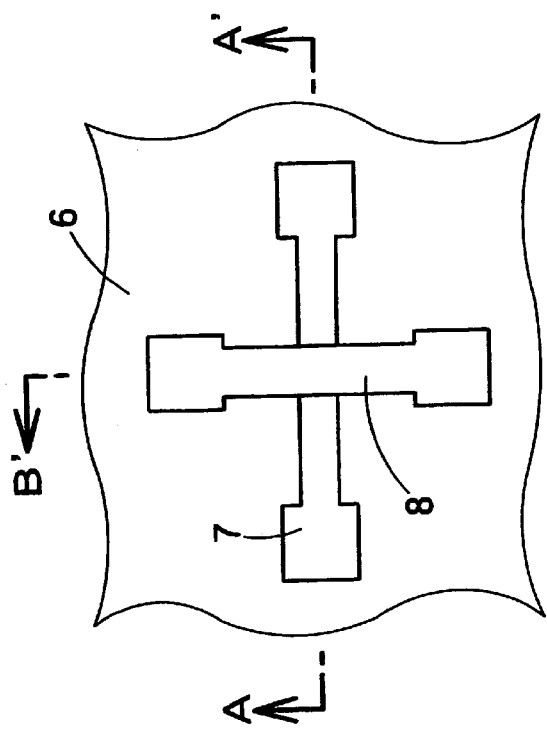
Figure 8B:
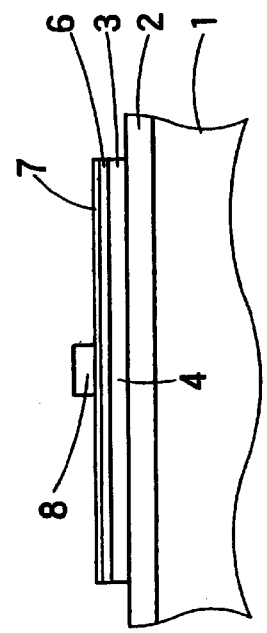

Next referring to FIGS. 8A through 8C, using the first mask material 7 and the second mask material 8 as a mask, the underlying SOI silicon layer 3 and patterned into a cross-shaped isle region. For this etching, RIE for etching silicon may be used.

Next referring to FIGS. 9A through 9C, processing of the protrusion is conducted. For this process, various methods are usable. However, here is explained a case using RIE. That is, the first mask material 7 except its part covered by the second mask material is removed by RIE for etching oxide and nitride films. In the removed region, the polysilicon layer 6 on the SOI silicon layer 3 is exposed. In this process, the second mask material 8 in the "longitudinal arm portion" is also etched slightly. However, by originally stacking it to an ample thickness, it is possible to maintain a thickness thereof around 200 nm, for example, necessary for behaving as a stopper film to prevent ion implanting into the external base region in a later process for making the emitter, etc. by ion implantation. The buried insulating film 2 is also etched slightly, but it is immaterial.

Subsequently, the exposed polysilicon layer 6 and the underlying SOI silicon layer 3 are etched to a desired depth. The etching depth must be deeper at least than the $p^+$-type region 9 extending from the polysilicon layer 6 to the $n^-$-type collector region 4 at this stage. The $p^+$-type region 9 is made by diffusing the p-type impurity from the polysilicon layer 6 by annealing.

Thickness of the $p^+$-type region 9 can be limited to approximately 50 nm by reducing the annealing time by using RTA (rapid thermal annealing) or by decreasing the annealing temperature to approximately 800° C. In this case, taking account of fluctuation of the etching depth, the SOI layer may be etched by approximately 80 nm. In this manner, the protrusion of the monolithic silicon layer which is one of features of the invention, is obtained.

Next referring to FIGS. 10A through 10C, the intrinsic base region 10 and the $n^+$-type emitter region 11 are made. Basically, these regions can be made by ion-implanting impurities into the "transverse arm portion". In this process, for the purpose of controlling the base width of the intrinsic base region 10, ion implantation of the emitter is preferably executed after ion implantation of the base and after a spacer 12 is made on the side wall of the "longitudinal arm portion".

The intrinsic base region 10 made by transverse diffusion has to be electrically connected to the $p^+$-type base region 9 in the protrusion. By RIE used for making the protrusion, side surfaces of the protrusion (arrow C in FIG. 10B) are not always made vertically, but are often made with a certain inclination depending upon the etching conditions. Therefore, in order to ensure that the impurity of the base is ion-implanted also into the slope portion so as to reliably make the p-type base lead-out region 9', both can be connected automatically. Alternatively, in order to connect the intrinsic base region 10 and the external base region 9 in the protrusion, ions may be additionally injected to the side surface of the protrusion from an oblique direction so as to make the base lead-out portion 9'.

An example of concrete manufacturing processes is explained below. After an oxide film with the thickness of approximately 5 nm is made on the exposed surface of the SOI silicon layer by thermal oxidation or CVD, boron is ion-implanted to make the base region. The resist pattern used here is the same as used later for the emitter, namely, a pattern opening in the region of the protrusion nearer to the emitter.

Subsequently, after the buffer insulating film is stacked by thermal processing or CVD, if necessary, a polysilicon layer is stacked by CVD, and it is etched back by RIE to make the side wall spacer 12 on the side wall of the protrusion. Thickness of polysilicon stacked here is approximately equal to the base width, and preferably about 100 nm, for example. After that, by ion-implanting arsenic (As), for example, the $n^+$-type emitter region 11 is made. Impurity concentrations are approximately 5E18 $cm^{-3}$ in the base region 10 and approximately 5E20 $cm^{-2}$ in the emitter region 1. Since the concentration in the emitter region is higher by the order of two digits, the p-type impurity injected into the emitter region is compensated, and a complete $n^+$-type region is obtained.

In the state of FIGS. 10A through 10C, the emitter-side SOI layer is covered by a resist mask 240B upon ion implantation of the emitter region. If an n-type impurity is injected by a high concentration to make the emitter region, then the SOI layer is entirely changed to an amorphous phase. As a result, upon re-crystallization in a later thermal processing, the silicon layer is poly-crystallized due to absence of single crystal seed near around, and the emitter resistance increases. To prevent it as far as possible, the resist mask 240B is used. That is, by covering the portion of the SOI layer with the resist mask 240B, the SOI source in the covered portion is prevented from changing into an amorphous phase and increasing in resistance, and the emitter region 11 once changed into an amorphous phase tends to re-crystallize from single crystal regions at its both sides. Even if it re-crystallize, its region can be minimized. In this manner, tendency of the emitter toward a high resistance can be prevented effectively.

In order to prevent a high-concentrated n-type impurity from being injected into the fringe region, for example, the resist pattern used for ion implantation of the emitter is preferably narrowed also in the longitudinal arm direction to the position shown by the dotted line in the drawing to remove the possibility of an adverse affection.

In order to make the depth direction of the film to function as a obtain a similar bipolar action in the entire film, it is preferable to make emitter and base profiles maintaining a uniform concentration in the depth direction by ion implantation using a plurality of different acceleration voltages.

Next referring to FIGS. 11A through 11C, the $n^+$-type external emitter region 12 and the $n^+$-type external collector region 13 are made. More specifically, a resist mask 250 is made, and an n-type impurity such as As (arsenic) or P is ion-implanted through an opening in the resist mask 250. To prevent the SOI film from being entirely changed to an amorphous phase along with ion implantation, shallow ion implantation making a peak concentration near the surface is preferable.

Here is shown a state where the polysilicon side wall spacer 12 has been removed. However, it may be maintained during this ion implantation, and may be removed later. In this case, since the $n^+$-type external collector region 13 can be made substantially in self alignment with the polysilicon side wall spacer 12, fluctuation in characteristics such as collector resistance and withstanding voltage of the junction between the base and the collector can be reduced.

Thereafter, a desired inter-layer insulating film 14 is made, contacts openings 15B, 15C and 15E are formed, and wirings 16 are made, to thereby complete BJT.

In the above-explained example, polysilicon is used as the buffer. However, to decrease the base resistance more, the buffer may be made by stacking a low-resistance material such as silicide film or metal film on the polysilicon layer. In this case, the following method may be used. That is, in the embodiment shown in FIGS. 2A through 2C, for example, it may be possible to stack a silicide or a metal on polysilicon as the buffer layer of FIGS. 6A through 6C, and take the same later steps as those explained above. However, since silicides and metals are generally less durable to high-temperature thermal process, there is the possibility of peeling of films or other troubles during thermal process for making diffusion layers in a later process. Therefore, it is necessary to make an external base exhibiting a lower resistance in a later process.

An example improved in this respect is explained below.

FIGS. 12A through 12C show a central part of BJT taken as such an example. A feature of the example lies in a silicide film 17 made on the upper surface of the external base region.

FIGS. 13A through 13C are diagrams showing BJT of FIGS. 12A through 12C under a manufacturing process. Here is shown a state of BJT after processing BJT of FIGS. 2A through 2C up to the state of FIGS. 11A through 11C by a method similar to the above-explained manufacturing process, then stacking an inter-layer insulating film 14' of an oxide film, for example, and then etching the insulating film 14', second and first mask materials by CMP (chemical mechanical polishing), for example, until exposing the surface of the external base region in the protrusion. The insulating film 14' is located slightly deeper than the protrusion because etching has been done by using diluted fluoric acid as a primary processing for starting silicide process in order to remove a native oxide film.

After that, through a normal silicide process, a second inter-layer insulating film 14' is stacked, contact holes 15B, 15C and 15E are made, and wirings 16 are made, to thereby complete BJT. In this case, as a method for making silicide, a metal such as titanium (Ti) or cobalt (Co) stacked by sputtering, for example, is annealed by RTA (rapid thermal annealing) for a short time to make the metal and silicon in the protrusion to react by means of silicide, and pre-reaction metal remaining on the insulating film 14', etc. is removed by wet processing, for example, to thereby make silicide in the protrusion in a self-alignment fashion (saliside process).

Figure 14A:
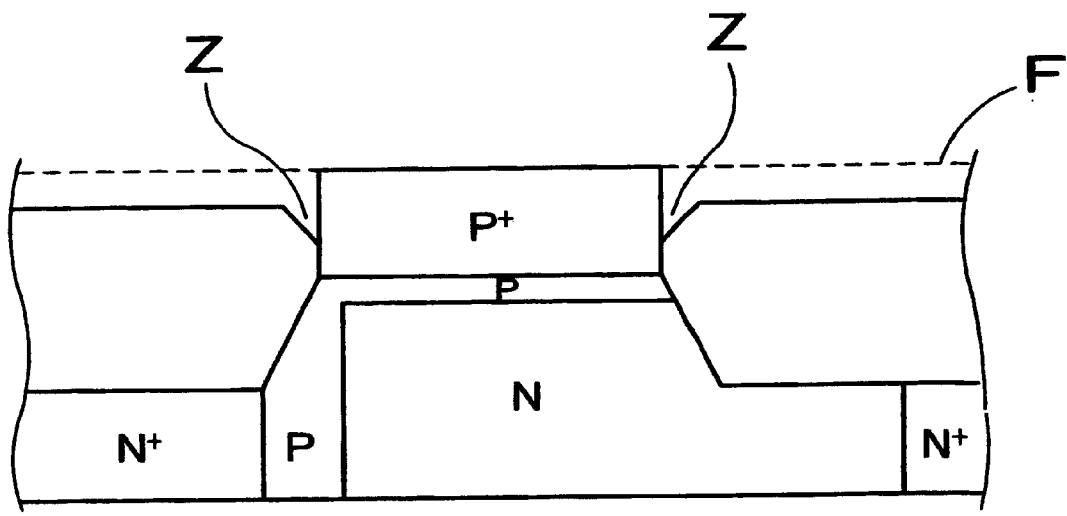
FIG. 14A is a cross-sectional view of a comparative example just before a silicide process.
Figure 14B:
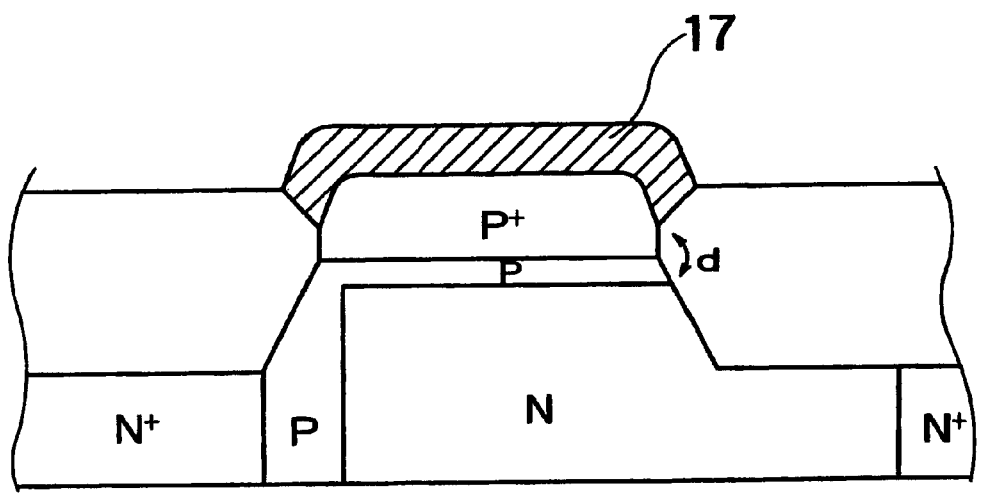
FIG. 14B is a cross-sectional view of the comparative example after the silicide process.

With reference to FIGS. 14A and 14B, here are reviewed problems in the silicide process and treatments therefor. FIG. 14A is a cross-sectional view of a comparative example just before the silicide process. In the comparative example, the surface of the insulating film 14' just after CMP is denoted by F. If the etching by diluted fluoric acid before the silicide process is done, the insulating film 14' along the side surface of the protrusion tends to be over-etched due to a stress as shown by Z in FIG. 14A.

If the silicide process is done onto the device at this stage, distance d between the silicide layer and the p-n junction of the protrusion become too much close at the bottom of a recess (shown by Z in FIG. 14A) formed on the side surface of the protrusion as shown in FIG. 14B. As a result, due to a stress caused by making the silicide layer 17 or diffusion of a metal from the silicide layer 17, or due to the depletion region contacting silicide, p-n junction property may deteriorate, and increase of the leakage current, deterioration of breakdown voltage or other problems may occur. Problems shown in FIG. 14B may occur also when the buffer layer 6 is originally thin.

Figure 15A:
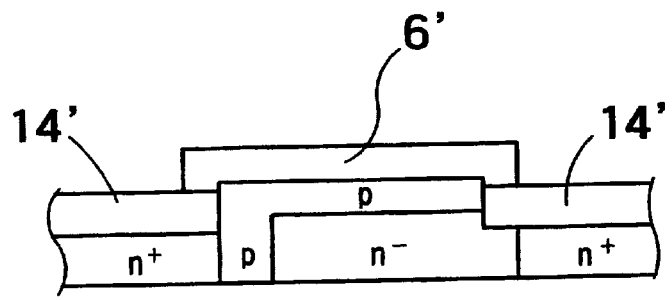
FIG. 15A is a cross-sectional view of an example just before a silicide process by the present invention.
Figure 15B:
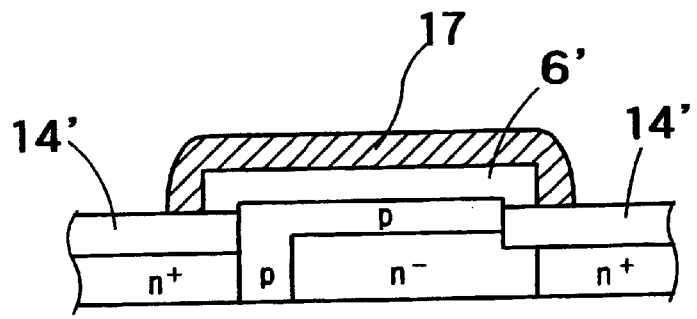
FIG. 15B is a cross-sectional view of the example after the silicide process by the present invention.

The Inventor has also invented a method overcoming these problems. That is, these problems can be removed by executing the silicide process after re-stacking polysilicon or epitaxial layer as a second buffer layer 6'. More specifically, as shown in FIG. 15A, after the second buffer layer 6' is processed, or after the second buffer layer 6' is selectively made in the protrusion by selective growth, the silicide layer 17 is made as shown in FIG. 15B. The silicide layer 17 is preferably made in self alignment with the second buffer layer 6' by a silicide process.

Figure 16A:
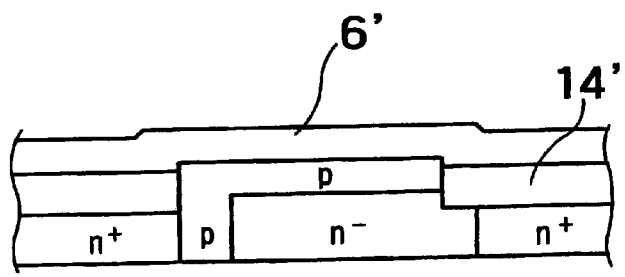
FIG. 16A is a cross-sectional view of an example just before a silicide process by the present invention.
Figure 16B:
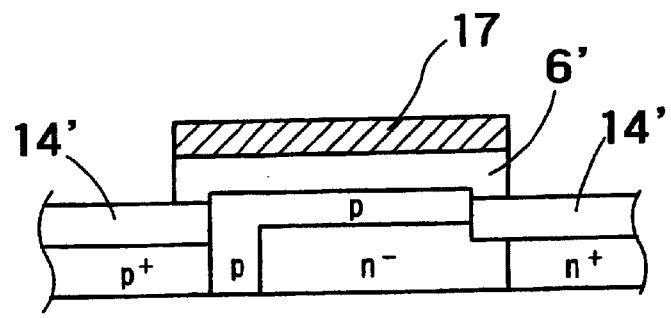
FIG. 16B is a cross-sectional view of the example after the silicide process by the present invention.

Alternatively, after stacking the second buffer layer 6' the entire surface of the device region as shown in FIG. 16A and directly stacking a silicide layer by using a silicide technique or by sputtering or CVD, the silicide layer 17 and the second buffer layer 6' may be patterned as shown in FIG. 16B.

Although here is shown the silicide layer as an example of a low-resistance material, a metal, for example, is also acceptable. In order to reduce the resistance of the second buffer layer 6', contact resistance between the first buffer layer and the second buffer layer and contact resistance between the second buffer layer and the silicide layer, respectively, the second buffer layer 6' is also required to be a high-concentrated $p^+$-type layer. For this purpose, various methods may be appropriately combined, such as implanting ions, using doped polysilicon or epitaxial layer, or the like.

Figure 17C:
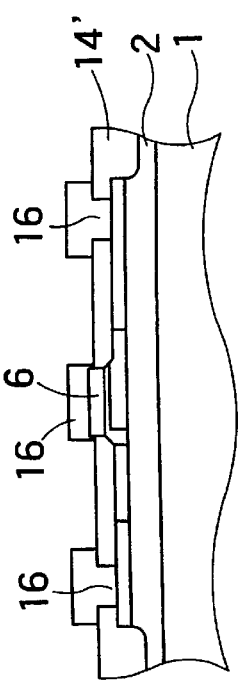
FIGS. 17A through 17C are diagrams showing BJT having a structure in which a silicide process merges with a wiring process.
Figure 17A:
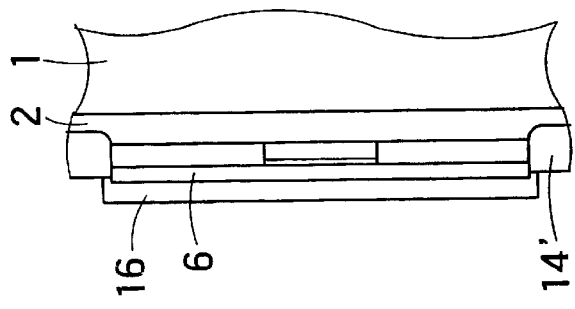
Figure 17B:
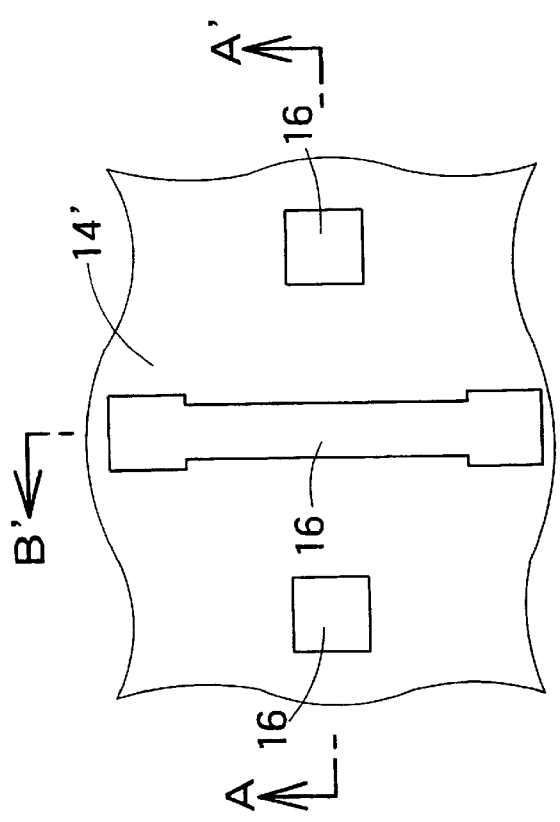

Next shown in FIGS. 17A through 17C is BJT with a structure in which the silicide process and conventional wiring process merge. A feature of BJT shown here lies in a conventional wiring material being bonded to the protrusion directly (in the case shown in FIGS. 17A through 17C) or via the second buffer layer. In this manner, the silicide process and the process for making the second inter-layer insulating film may be omitted to reduce the process cost. Moreover, since contact holes are as shallow as the height of the protrusion approximately, the burying process may be omitted.

As a method commonly applicable to all processes for exposing the protrusion by CMP, without making the $p^+$ layer of the protrusion previously (in case of this example), the $p^+$ region can be made after making the protrusion. That is, except the a p-type diffusion layer which may be formed by doping simultaneously with ion implantation of the intrinsic base, concentration is limited to a minimum necessary value such as concentration enabling formation of a shallow diffusion layer or the process of making the $p^+$ layer previously in the upper portion of the protrusion can be eliminated (in case of this example). Then, by ion implantation, for example, after exposure of the protrusion by CMP, the $p^+$ region may be made. In this fashion, the shallow $p^+$ region can be made under a good control without being influenced from an annealing process during the process. Therefore, without the $p^+$ layer, and since the first buffer layer may be omitted, the width of the etching region required for making the protrusion can be reduced, and the process controllability is also improved.

Figure 18C:
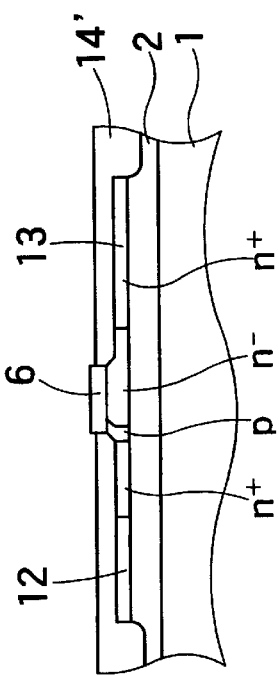
FIGS. 18A through 18C are diagrams showing a manufacturing process corresponding to FIGS. 13A through 13C.
Figure 18A:
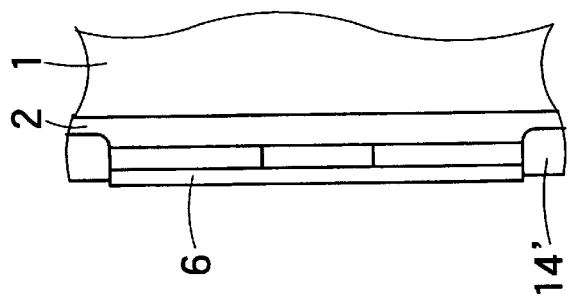
Figure 18B:
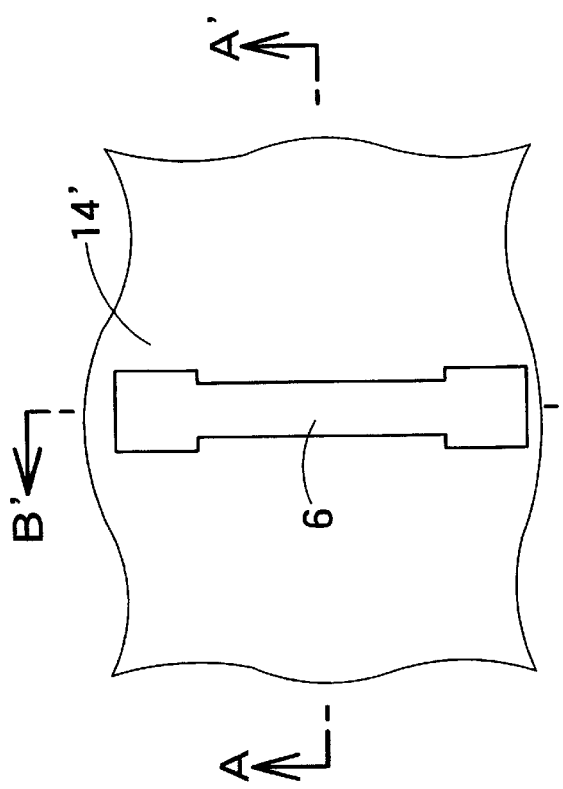

The manufacturing method used here is the same as the first embodiment up to the step shown in FIGS. 18A through 18C corresponding to FIGS. 13a through 13C. However, in this embodiment, since the first buffer layer 6 is not doped previously, the external base p layer is not made yet in FIGS. 18A through 18C. After that, by ion-implanting a p-type impurity such as boron and annealing it for minimum necessary activation, a shallow $p^+$ layer with a high concentration and a low resistance can be made.

In case of making a shallower external base by ion implantation, Si or Ge is ion-implanted to change the surface portion of the single crystal silicon into the amorphous phase to thereby prevent "channeling". This is advantageous in enabling a shallow p-n junction to be made without making the polysilicon layer. This method is effective also when the external base is made previously.

Figure 19A:
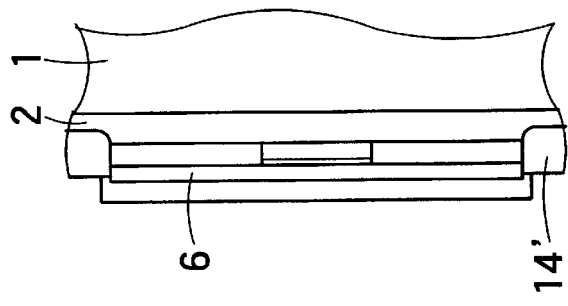
FIGS. 19A through 19C are diagrams showing a manufacturing process in which contact holes 15E, 15C to the emitter or the collector are being made.
Figure 19B:
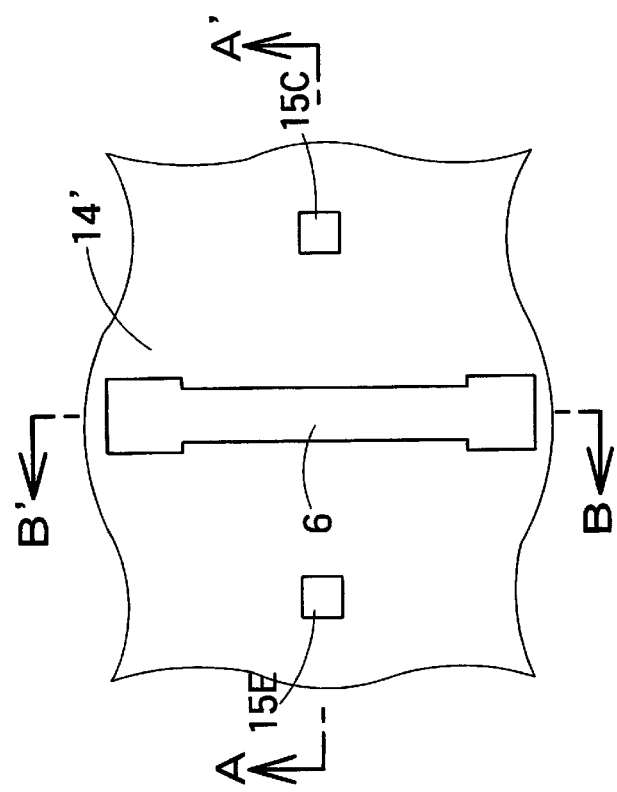
Figure 19C:
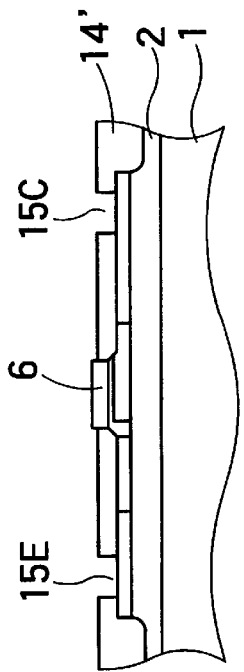

After that, as shown in FIGS. 19A through 19C, contact holes 15E, 15C to the emitter or the collector are made. The contact hole 15B to the external base need not be used here. After that, a predetermined wiring material is stacked and patterned, and the wiring 16 in which the wiring to the base is configured to cover the protrusion is made, to thereby complete BJT.

Next reviewed are problems involved in the process using CMP and treatments thereof. In the process using CMP as explained heretofore, etching is stopped at the surface of the protrusion. However, when using this method, a thick protrusion must be made previously, taking account of overetching. As a result, the etching amount required for thinning the emitter portion increases, and it may increase fluctuation in thickness of the emitter portion due to fluctuation in etching amount, and may finally increase fluctuation in device characteristics. Additionally, since it results in directly scraping the protruding element region by CMP, there may arise influences by etching damage or stress.

To remove these problems, an etching stopper may be used. In this case, it is advantageous to use the first or second mask material as the stopper not to increase the steps. An example taking it into account is shown below.

FIGS. 20A through 20C show an example of BJT made by using as a stopper of CMP the silicon nitride film used as the first mask material. This example makes it possible to minimize over-etching in the process for exposing the protrusion by CMP. Its manufacturing method may be the same as those of the foregoing embodiments. However, in order to use the nitride film as the stopper upon CMP under the condition for etching an oxide film, it is necessary to determine the thickness of the nitride film (first mask material 7), taking into account of the etching selectivity which CMP has.

Figure 21C:
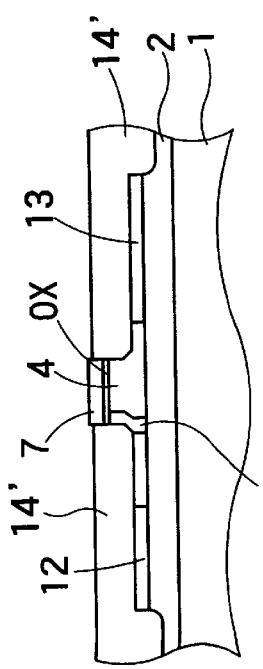
FIGS. 21A through 21C are diagrams showing a configuration in which CMP is performed and a first mask material 7 stops etching.
Figure 21A:
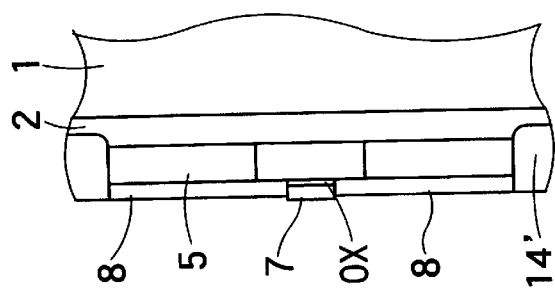
Figure 21B:
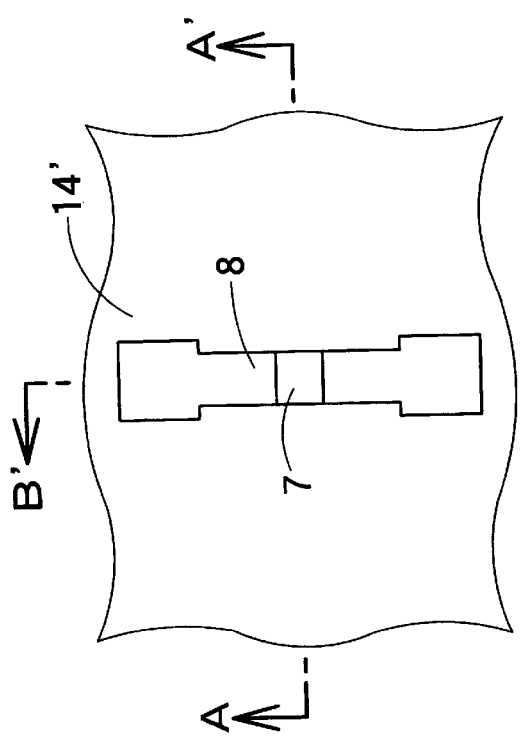

FIGS. 21A through 21C show a state where CMP has been conducted and etching has been stopped by the first mask material 7. Although this example does not use the first buffer layer, there is no inconvenience because over-etching of CMP does not occur.

After that, as shown in FIGS. 22A through 22C, the first mask material 7, i.e. the nitride film, is removed by using CDE (chemical dry etching), for example. In this process, since it is removed by the etching selectivity as large as decades or more against the under-lying oxide film OX, there is no possibility of over-etching the protrusion. In this status, ions are injected into the protrusion via the thin oxide film OX to make the external base region, the thin oxide film OX is removed by wet etching of dilute fluoric acid, for example, and the second buffer layer, silicide layer, merge process with wiring process, etc. may be combined appropriately.

For example, as shown in FIGS. 23A through 23C, after selectively making it on the protrusion by stacking borondoped polycrystalline silicon as the second buffer layer 6' and etching-back it, silicide process or merge process with wiring may be used.

In the embodiment shown in FIGS. 21A through 21C, since the first mask material 7 made amply thick and remaining on the intrinsic region of the longitudinal arm is used as the stopper, opposite ends of the longitudinal arm hide under the thick second mask material. Although it is immaterial in the wiring merge process because the contact is directly made on the intrinsic portion, in case of malding a silicide film and then making contacts at opposite ends, wiring resistance of the longitudinal arm may increase near the contacts unless the external base region is previously made on the entirety of the longitudinal arm portion.

Therefore, in some cases, BJT made from a mask material on the longitudinal arm without using the first mask material 7 on the transverse arm is preferable. There is a method using LOCOS as a process for previously making a mask material on the longitudinal arm.

Figure 24A:
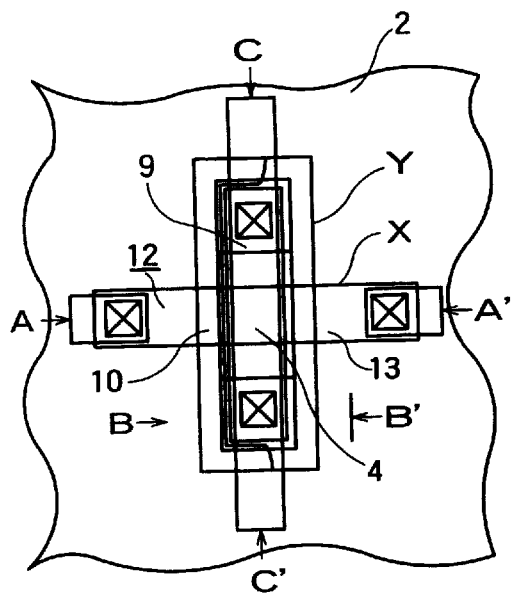
FIG. 24A is a plan view of a central part of an example of BJT made by employing LOCOS.
Figure 24B:
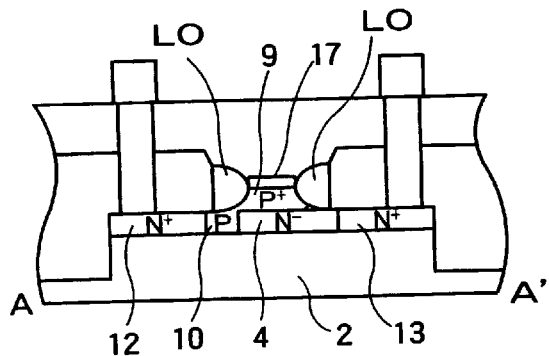
FIG. 24B is a cross-sectional view taken along the A–A' line of FIG. 24A.
Figure 24C:
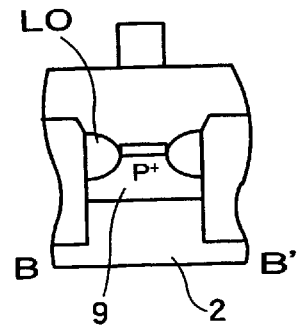
FIG. 24C is a cross-sectional view taken along the B–B' line of FIG. 24A.
Figure 24D:
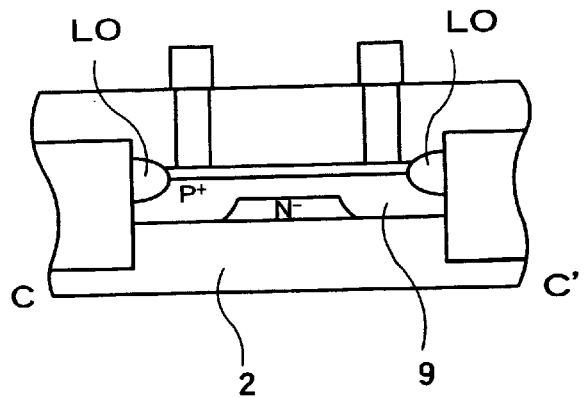
FIG. 24D is a cross-sectional view taken along the C–C' line of FIG. 24A.
Figure 25A:
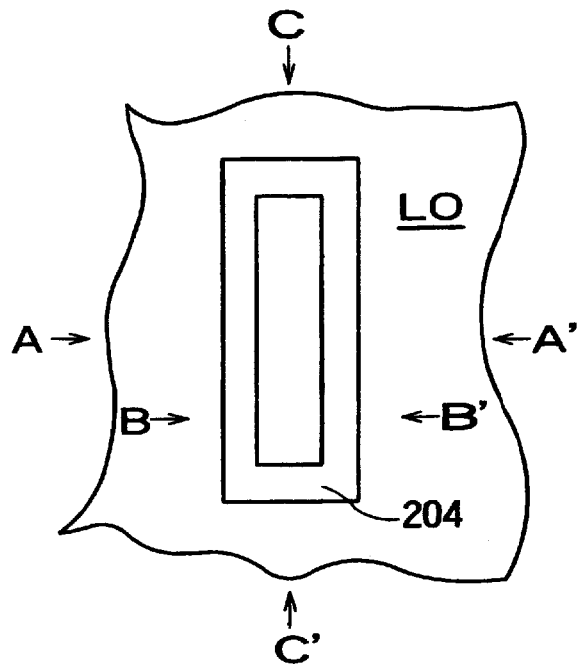
FIGS. 25A through 25D are diagrams showing a manufacturing process of BJT shown in FIGS. 24A through 24D.
Figure 25B:
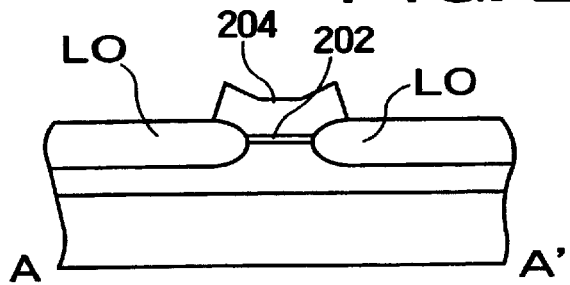
Figure 25C:
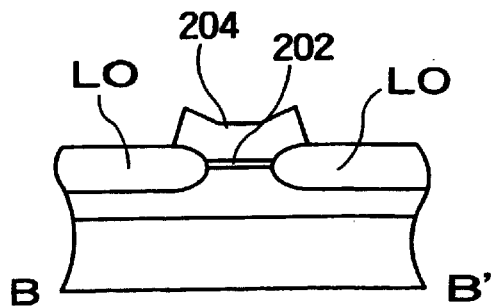
Figure 25D:
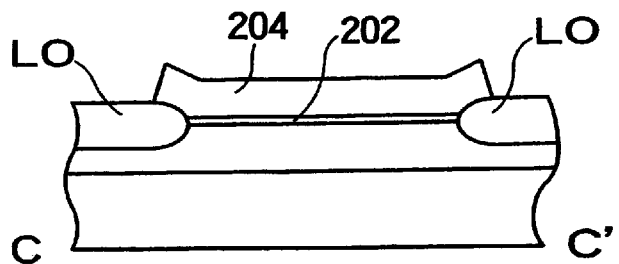

FIGS. 24A through 24D are diagrams showing an example of BJT employing LOCOS. That is, FIG. 24A is a plan view of its central part, and FIGS. 24B, 24C and 24D are cross-sectional views taken along the A–A' line, B–B' line and C–C' line of FIG. 24A, respectively. As to BJT shown here, the same portion as those of the foregoing examples are labeled with common reference numerals, and their detailed explanation is omitted. A feature of this BJT lies in that an oxide film LO by LOCOS is formed beside the protrusion forming the central part of the transistor and the silicide film 17 is selectively formed on the protrusion by the oxide film LO. Another feature lies in that the oxide film LO is "bird's beak"-shaped as a result of being made by LOCOS.

FIGS. 25A through 25D are schematic diagrams showing a part of a manufacturing process of BJT. That is, when manufacturing BJT, a LOCOS oxide film is selectively made in the region except the region along the "longitudinal arm portion" by using LOCOS as shown in FIGS. 25A through 25D. More specifically, a thin oxide film 202 is made on the SOI layer 4, and a silicon nitride film 204 is selectively made in alignment with the pattern of the "longitudinal arm portion". Then, peripheral part of the SOI layer 4 not covered by the silicon nitride film 204 is oxidized to make thick LOCOS oxide film LO. As a result, the region of the SOI layer to be reformed later as the emitter and the collector is thinned by oxidation. In this process, the remainder thickness of the film can be controlled within the range of ±10% of the oxidized amount. Additionally, as a result of the LOCOS oxidation, a "bird's beak" configuration is made at ends of the oxide film LO.

According to this example, the protrusion can be made with its periphery encircled by the LOCOS oxide film LO.

After that, using the nitride film 204 as a mask, for example, the oxide film LO is etched by RIE to expose the thinned SO film 4, the pattern of the "transverse arm portion" is made of a resist, and the SOI layer 4 is patterned by using the resist and the nitride film as a mask. Then, in a process using the nitride film 204 as the stopper of CMP in the same manner as the process explained before, BJT shown in FIGS. 24A through 24D can be made. According to this example, additionally obtained is the effect that the thickness of the thin film portion of the SOI layer around the protrusion can be more precisely controlled than by controlling it by etching.

On the other hand, as a common problem of lateral BJTs using single crystal silicon, there is the problem that a high gain and high $f_T$ may not be obtained. This problem occurs because, in case of lateral BJT, unlike a poly-emitter used in a normal bulk (with which a high-concentrated steep emitter profile can be made by using impurity diffusion from polysilicon), the emitter impurity profile at the emitter-base junction is liable to be less steep. This may enhance the injection of hole from the base to the emitter and generate the excess carrier which cause the degradation of the gain and/or $f_T$. An example as a countermeasure against this problem is shown below.

As shown in FIG. 26A, prior to ion injection of the emitter, processing for making amorphous phase is conducted at least locally. More specifically, a resist mask 200 is made, and silicon (Si) or germanium (Ge) is ion-implanted by a high concentration, to thereby makes an amorphous region AP.

After that, as shown in FIG. 26B, by poly-crystallizing the amorphous region AP by annealing to change it to a poly-crystalline region PC, the same structure as a bulk BJT is obtained. Thereafter, arsenic (As) or phosphorus (P) is ion-implanted as the emitter impuity into the polycrystalline region PC.

After that, as shown in FIG. 26D, in the same manner as the case of the external base (FIG. 3A), by annealing for activation, As or P diffuses within the polycrystalline region in a short time, and diffusion is suppressed at the interface with the single crystal portion. As a result, in the same fashion as the case of a bulk BJT, a steep emitter 11 toward the base side is obtained. In this case, however, there is the possibility that the polycrystaline region PC comes too much closer to the position of the emitter-base junction, and increase the junction leakage. As shown in FIG. 26C, by omitting poly-crystallization and re-crystallizing a part of the amorphous region AP by annealing after ion implantation for the emitter into the amorphous region AP, relation between the position of the polycrystalline region and the position of the emitter-base junction can be controlled. Alternatively, by re-crystallizing the amorphous region by activating annealing to return it into the single crystal phase, a steep profile, good junction property, and a low-resistance emitter layer can be obtained at once.

Next explained is another example of the semiconductor device according to the invention.

Figure 27A:
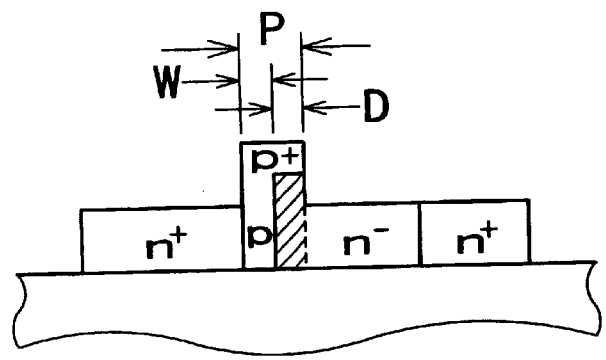
FIGS. 27A and 27B are cross-sectional views of a central part of BJT according to the invention, which correspond to cross-sectional views taken along the A–A' line of FIG. 1.

FIG. 27A is a cross-sectional view of a central part of BJT according to the invention, and corresponds to an A–A' cross-sectional view of FIG. 1. A feature of this example lies in that a side surface of the protrusion nearer to the collector substantially coincides with the head end of the depletion region (shown by the hatching) which extends from the intrinsic base region 10 to the collector region 4. That is, when BJT is activated for bipolar action, a depletion region extends from the intrinsic base region 10 to the collector region 4. If the width of the depletion region is D, the width P of the protrusion equals the total of the width W of the intrinsic base region 10 and the width D of the depletion region. As a result, the base-collector parasitic capacitance is minimized without a large increase in base resistance.

Figure 27B:
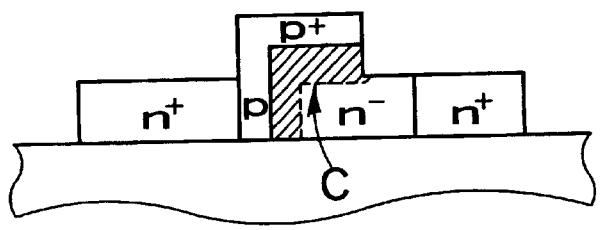

That is, with reference to FIG. 27B, if the width P of the protrusion is wider, then an excessive junction capacitance is made at the portion shown by arrow C by the depletion region (shown by the hatching) extending downward from the $p^+$-type region 9.

In contrast, according to the example shown here, as shown in FIG. 27A, the depletion region extending from the $p^+$-type region 9 to the collector region 4 can be removed substantially, to thereby decrease the parasitic capacitance and remarkably improve the high-frequency property.

Next explained is another example of the semiconductor device accordion to the invention.

Figure 28A:
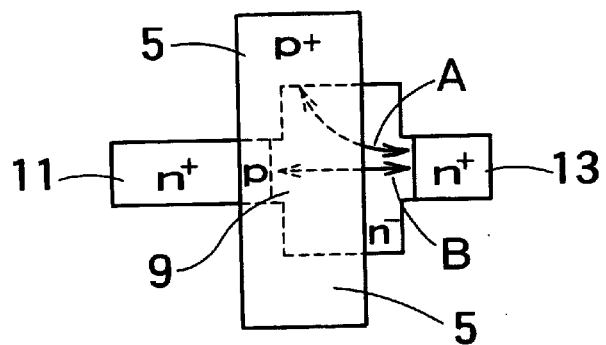
FIGS. 28A and 28B are diagrams showing a central part of BJT according to the invention, which correspond to a plan view and a A–A' cross-sectional view of FIG. 1.
Figure 28B:
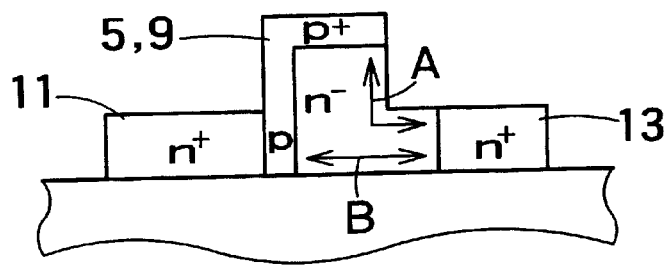

FIGS. 28A and 28B are diagrams schematically showing a central part of BJT according to the invention, and they correspond to the plan view of FIG. 1A and the cross-sectional view of FIG. 1B. This example is characterized in positional relations of the p-type region 10, $p^+$-type region 9 and the fringe regions 5, which are the outer parts of the $p^+$-type region 9, with the $n^+$-type external collector region 13. That is, as shown in FIG. 28A, effective distance (A) from the fringe region 5 to the external collector region 13 is approximately equal to or longer than distance (B) between the intrinsic base region 10 and the external collector region 13. This is attained by expanding the transverse arm portion in the collector $n^-$-type region and narrowing the external collector region 13 as shown in FIG. 28A. Also in FIG. 28B, effective distance (A) from the $p^+$-type region 9 to the external collector region 13 is determined to be approximately equal to or longer than the distance (B) between the intrinsic base region 10 and the external collector region 13. This is attained by adjusting the length of the side edge of the protrusion and the thickness of the $p^+$-type region.

In BJT, in general, withstanding voltage of an element is often determined by base-collector breakdown voltage. The base-collector breakdown voltage is determined by the concentration in the collector region and the effective distance between the base and the external collector, which is shown at B in the drawing. That is, the lower the collector concentration, and the shorter the distance B, the higher the breakdown voltage, in most cases. In contrast, in the present invention, since the base is led out to the $p^+$-type regions 5 and 9, a current path shown at A is additionally made. Therefore, in order to ensure that the withstanding voltage never degrades due to the path A, the effective distance is preferably longer than the path B. Such design of the element enables realization of BJT reduced in base resistance and excellent in high-frequency property without degrading the base-collector breakdown voltage.

Next explained are further examples of the semiconductor device according to the invention.

Figure 29A:
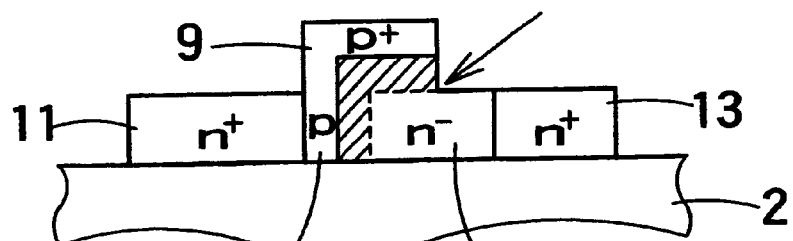
FIGS. 29A is a diagram showing a central part of an example of BJT according to the invention, which corresponds to a A–A' cross-sectional view of FIG. 1.

FIG. 29A is a diagram schematically showing a central part of the example of BJT according to the invention, and it corresponds to the A–A' cross-sectional view of FIG. 1B.

Figure 29B:
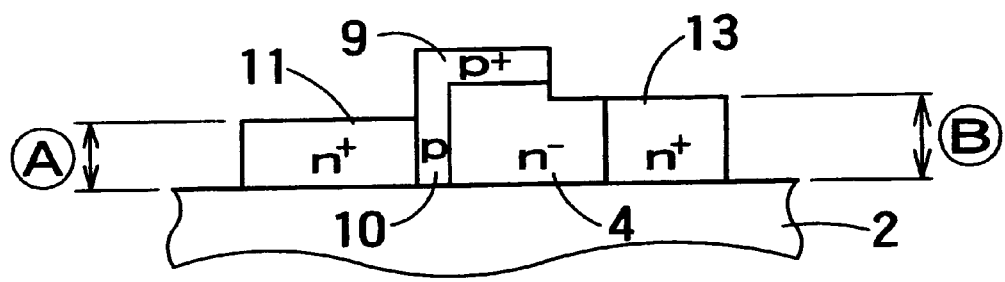
FIG. 29B is a diagram showing a central part of an example of BJT according to the invention, which corresponds to a A–A' cross-sectional view of FIG. 1.

FIG. 29B is a diagram schematically showing a central part of the example of BJT according to the invention, and it corresponds to the A–A' cross-sectional view of FIG. 1B.

Figure 30:
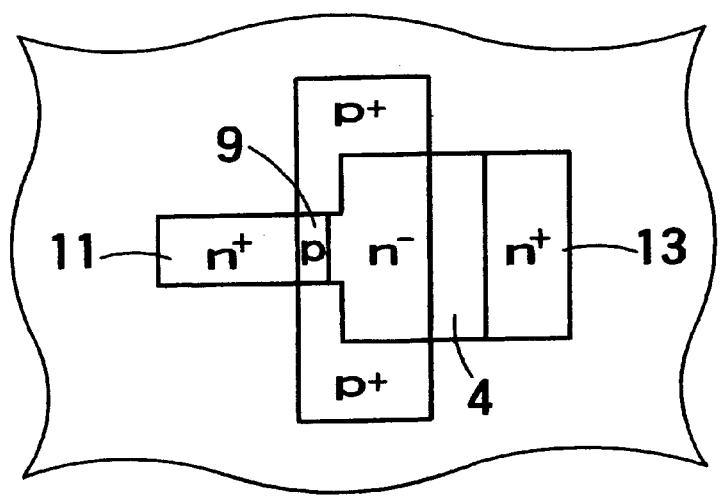
FIG. 30 is a diagram showing a central part of an example of BJT according to the invention, which corresponds to a plan view of FIG. 1.

FIG. 30 is a diagram schematically showing a central part of the example of BJT according to the invention, and it corresponds to the plan view of FIG. 1A.

The examples shown here are characterized in preventing concentration of a current in the collector region and thereby preventing deterioration in high-frequency property by so-called Kirk effect. In the example shown in FIG. 29A, position of the head end of the depletion region (arrow-marked in the drawing) extending downward from the $p^+$-type region 9 during operation of BJT comes to the lower end of the side surface of the protrusion, namely, substantially the same level as the height of the surface of the external collector region 13. In this manner, the problem that the depletion region extends too much and blocks the path for the collector current can be removed. In this case, from the viewpoint of suppressing the Kirk effect, the head end of the depletion region had better be offset to the upper side of the protrusion. However, since this results in elongating the base lead-out region too much and increases the base resistance, the above-proposed degree is preferable.

In FIG. 29B, the path of the collector current can be reliably reserved similarly, by increasing the thickness B of the collector-side layer thicker than the thickness A of the emitter side layer.

In FIG. 30, in the plan-view pattern, the width of the collector-side pattern is made wider than emitter-side one. These examples reliably reserve the collector current path, and prevent increase in collector resistance. These examples may be combined appropriately.

Next explained are further examples of the semiconductor device according to the invention.

Figure 31:
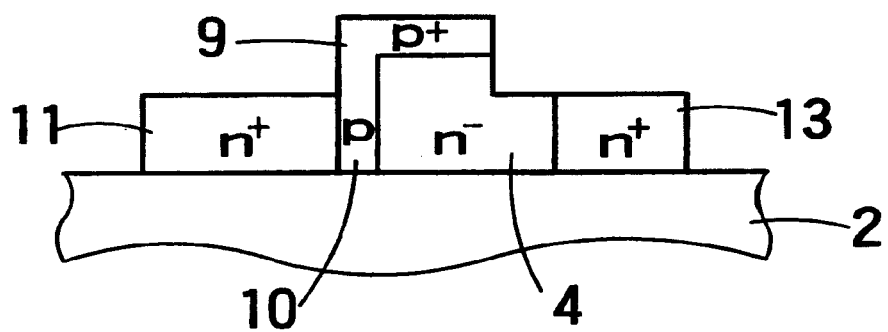
FIGS. 31 through 33 are diagrams showing central parts of examples of BJT according to the invention, which correspond to A–A' cross-sectional views of FIG. 1.
Figure 32:
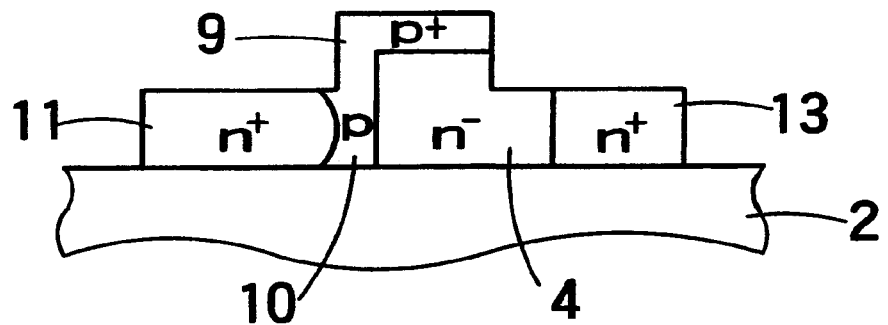
Figure 33:
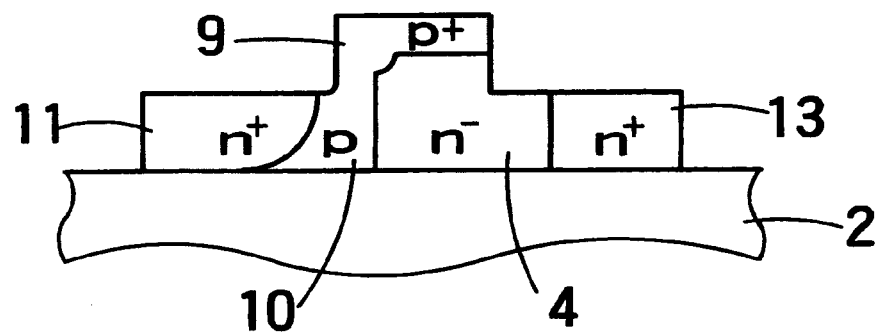

FIGS. 31 through 33 are diagrams each showing central parts of BJTs taken as examples of the invention, respectively, and they correspond to the A–A' cross-sectional view of FIG. 1B. Concept of these examples lies in realizing higher performance by controlling impurity profiles of the emitter region and the base region.

In BJT of FIG. 31, uniform profiles in the thickness direction are made in the intrinsic base region 10 and the emitter region 11, respectively, to realize uniform bipolar action throughout the entire thickness direction of the SOI layer. In this manner, substantially linear emitter-base junction can be made also in the depth direction as illustrated.

This can be attained by performing ion implantation of the base in three different steps for a 0.1 μm thick emitter region, for example. That is, in the first step, $BF_2^+$ is ion-implanted to a shallow depth through a buffer oxide film with the thickness of 200 angstroms under the acceleration voltage of 25 KeV and doze amount of 1E13 $cm^{-2}$. In the second step, $B^+$ is ion-implanted to an intermediate depth under the acceleration voltage of 15 KeV and doze amount of 1E13 $cm^{-2}$. In the third step, $B^+$ is ion-implanted to a deeper depth under the acceleration voltage of 25 KeV and doze amount of 4E13 $cm^{-2}$.

By such multi-step ion implantation, the intrinsic base region 10 having a uniform impurity concentration as high as 4E18 $cm^{-3}$ in the depth direction can be made even through annealing at a low temperature around 800° C.

Also in the emitter region 11, a uniform concentration profile can be obtained by three-step ion implantation explained below. That is, in the first step, $As^+$ is ion-implanted to a shallow depth under the acceleration voltage of 45 KeV and doze amount of 4E14 $cm^{-2}$. In the second step, $As^+$ is ion-implanted to an intermediate depth under the acceleration voltage of 80 KeV and doze amount of 4E14 $cm^{-2}$. In the third step, $As^+$ is ion-implanted to a deeper depth under the acceleration voltage of 160 KeV and doze amount of 1.8E15 $cm^{-2}$. By such three-step ion implantation, the emitter region 11 having a uniform impurity concentration as high as 2E20 $cm^{-3}$ in the depth direction can be made even through annealing at a low temperature around 800° C.

In the example shown in FIG. 32, the intrinsic base region 10 makes a convex side surface toward the emitter in order to prevent punch-through phenomenon which may when boron as the base impurity is absorbed out along the surface of the SOI silicon layer or the interface with the buried oxide film. This structure can be made by adjusting the emitter impurity concentration to be higher in the intermediate depth. That is, among the above-explained three-step ion implantation for making the emitter region with reference to FIG. 31, the amount of the injected impurity may be reduced in the first step and the third step.

Alternatively, the impurity concentration profile of the intrinsic base region 10 may be adjusted. That is, the same structure as shown in FIG. 32 can be realized by adjusting the ion implantation conditions to make a high impurity concentration near the upper and lower surfaces.

Additionally, in the present invention, since the top surface side of the intrinsic base region is connected to the $p^+$-type region 9, punch-through is relatively prevented. Therefore, the intrinsic base region 10 is preferably configured so that its bottom-side portion bites into the emitter side deeper. The example of FIG. 33 is based on this concept. In addition to these examples, there are various modes for making and maintaining an accumulation state in the bottom side of the intrinsic base region and preventing punch-through, such as making a higher p-type than that of the intrinsic base region 10 as the conduction type of the substrate 1 under the buried oxide layer 2, or applying a bias that is negative to the base bias.

Next explained are still further examples of the invention.

Figure 34:
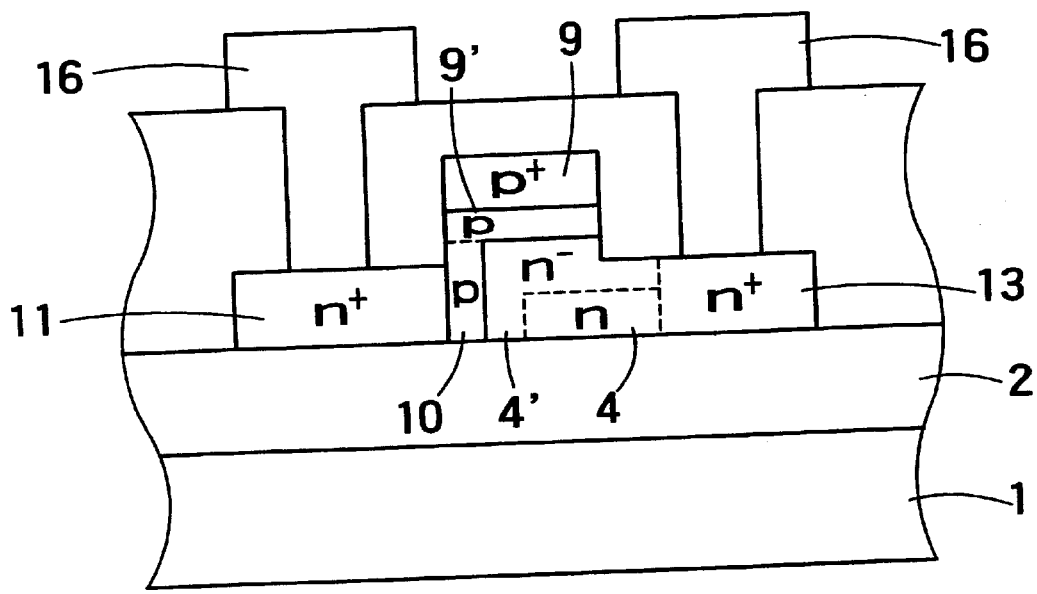
Figure 35:
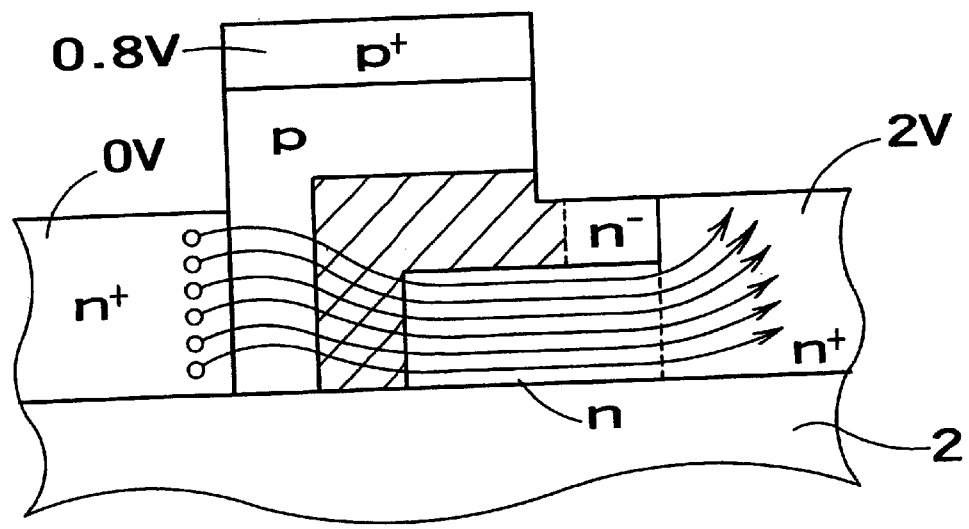

FIGS. 34 through 36F are diagrams for explaining BJT taken as an example of the invention. FIG. 34 is a cross-sectional view of its central part, FIG. 35 is a schematic diagram showing flows of a current, and FIGS. 36A through 36F are cross-sectional views of its central part under a manufacturing process, which correspond to the A–A' cross-sectional view of FIG. 1B.

FIG. 37 is a diagram for explaining BJT taken as another example of the invention, and it corresponds to the A—A cross-sectional view of FIG. 1B.

Figure 38:
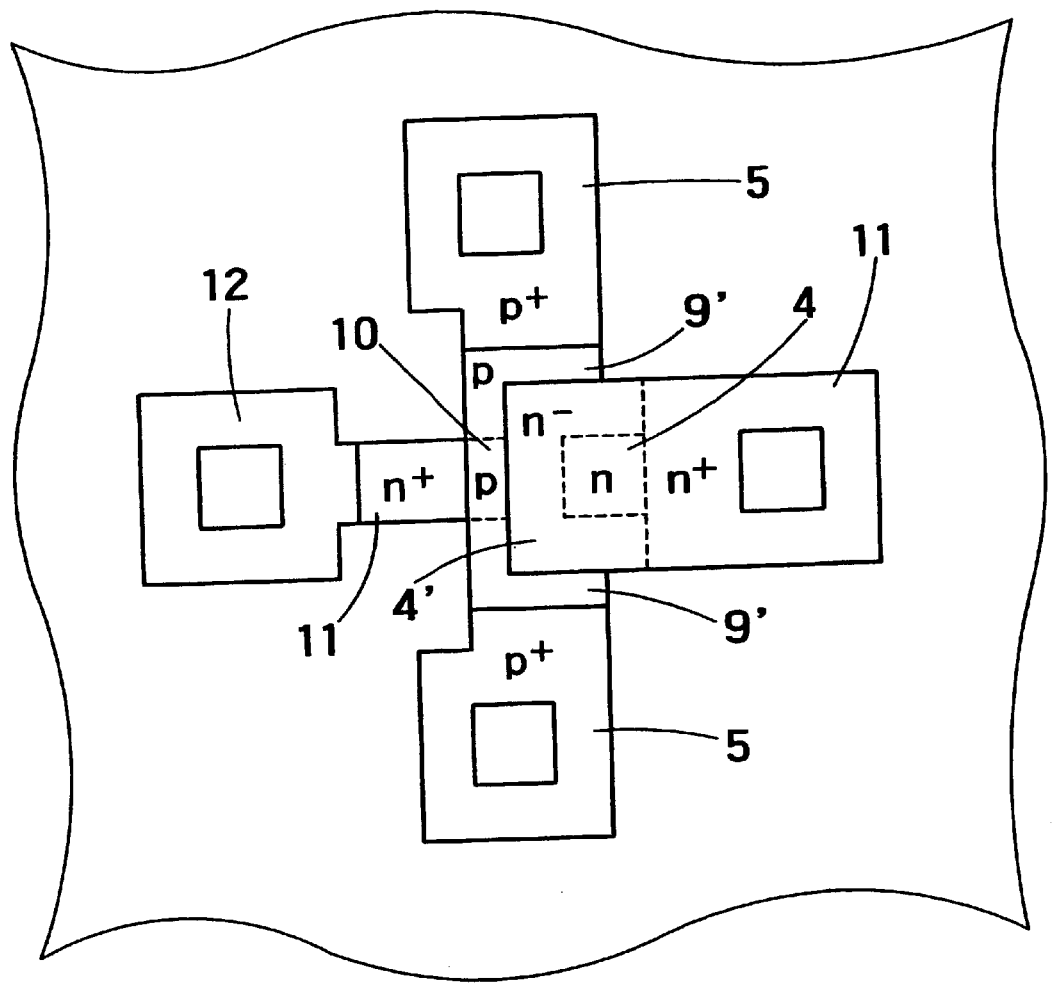
FIG. 38 is a diagram for explaining another example of BJT according to the invention, which corresponds to a plan view of FIG. 1.

FIG. 38 is a diagram for explaining BJT taken as another example of the invention, and it corresponds to the plan view of FIG. 1A.

These examples can reduce the collector resistance without degrading the collector breakdown voltage, preventing the base expanding effect, increasing the operation voltage range and operation current range, and remarkably improve the high-frequency property.

In the structure shown in FIG. 34, the emitter region is an type semiconductor having an impurity concentration around 1E20 $cm^{-3}$, the intrinsic base region 10 is a p-type semiconductor having an impurity concentration around 1E18 $cm^{-3}$, and the $n^-$-type collector region 4' is an n-type semiconductor having an impurity concentration around 1E17 $cm^{-3}$, formed near the upper surface of the protrusion is the $p^+$-type external base region 9. Under the external base region 9, the base lead-out region 9' having a lower impurity concentration is made. The base lead-out region 9' is a p-type semiconductor having substantially the same impurity concentration as that of the intrinsic region 10, and its location may be limited to just above the intrinsic base region 10 as shown in FIG. 1B.

The n-type collector region 4 is made adjacent to the $n^-$-type collector region 4'. The n-type collector region 4 is an n-type semiconductor region having a higher impurity concentration, and it is located in close contact with the external collector region 13 and isolated from the intrinsic base region 10 and the base lead-out region 9'.

FIG. 35 is a diagram schematically showing flows of electrons during operation of BJT. Voltages at respective terminals may be, for example, 0 V for the emitter, 0.8 V for the base, and 2 V for the collector. Electrons injected from the emitter region into the base region diffuse through the base, and reach the depletion region (shown by the hatching) formed between the base and the collector. There, the electrons are pulled by an intensive electric field in the depletion region, and rush into the collector region. For a better high-frequency operation, width of the intrinsic base region 10 is preferably not larger than 0.1 μm. In certain cases, width of the base lead-out region 9' is required to be at least 0.3 μm due to restriction from the processing viewpoint. Therefore, in this case, the collector region in which electrons flow inevitably exists under the base lead-out region 9'. Potential of the base lead-out region 9' is approximately equal to the potential of the base electrode, 0.8 V, and potential of the collector region is approximately equal to the potential of the collector electrode, 2 V. As a result, electrons in the collector region result in mainly flowing through a region nearer to the buried oxide layer 2. In this case, the cross-sectional area of the path for electrons in the collector region is slightly reduced. However, in this example, since this region has a high impurity concentration, and collector resistance does not increase substantially, and it is reduced by as much as one digit from resistance value in the conventional device.

When the collector current increases, extension of the depletion is stopped by the n-type collector region 4. Therefore, occurrence of base expansion effect is reduced, and the high-frequency property is improved. Additionally, since the base lead-out region 9' does not contact the n-type collector region having a high impurity concentration, withstanding voltage of the collector does not degrade.

FIGS. 36A through 36F are cross-sectional views showing a manufacturing method of BJT according to the invention. Details thereof, such as mask materials, are not illustrated.

Figure 36A:
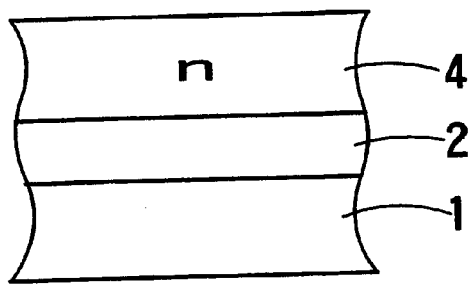

As shown in FIG. 36A, first prepared is an SOI wafer including the n-type SOI layer 4 of approximately 1E18 $m^{-3}$ to 1E19 $cm^{-3}$ formed on the buried oxide film 2. This wafer may be any of SOI wafers called SIMOX (separation by implanted oxygen), bonded SOI wafer, or SOS (silicon on sapphire) wafer. Alternatively, also usable is a wafer made by ion-implanting an n-type impurity into a p-type semiconductor SOI wafer having an impurity concentration around 1E15 $cm^{-3}$ in order to obtain an n-type semiconductor thin film layer of approximately 1E18 $cm^{-3}$ through 1E19 $cm^{-3}$.

Figure 36D:
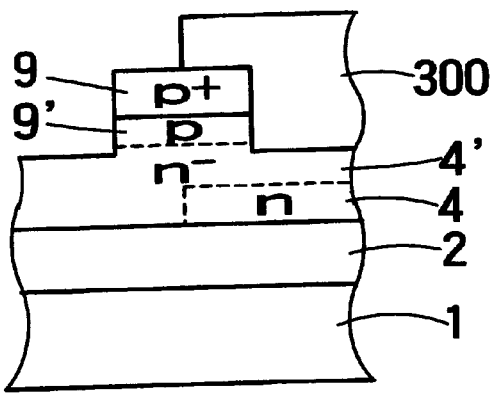
Figure 36B:
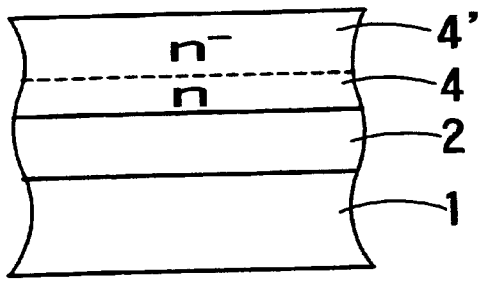

Next, as shown in FIG. 36B, the n-type semiconductor layer 4' of approximately 1E17 $cm^{-3}$ is made on the n-type SOI layer 4 by ion implantation of a p-type impurity.

Figure 36E:
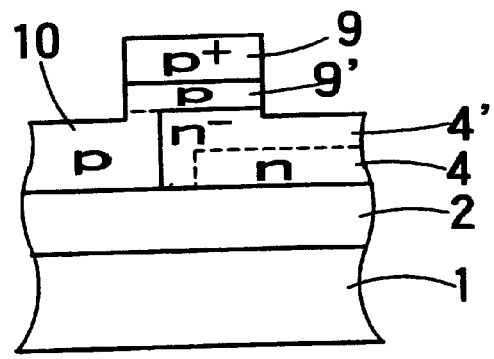
Figure 36C:
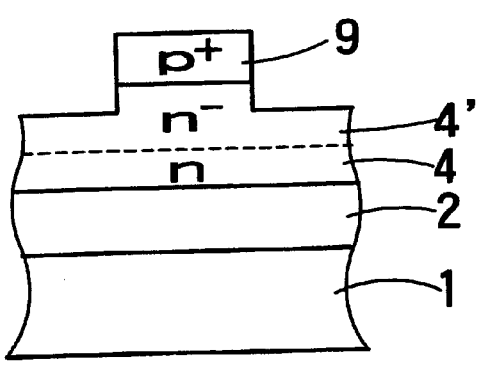
Figure 36F:
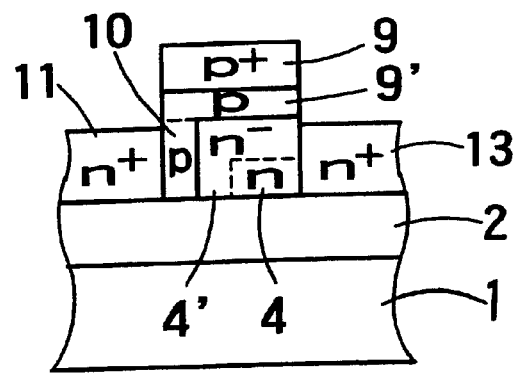

Next as shown in FIG. 36C, the protrusion is made by etching such as RIE. The external base region 9 may be either a polysilicon layer or a single-crystalline silicon layer.

Next as shown in FIG. 36D, a part of the protrusion nearer to the collector region is masked by a resist 300, and a p-type impurity is ion-implanted to partly cancel the impurity in the n-type region 4 so that a part of the n-type region 4 is adjusted in impurity concentration to a value approximately equal to the concentration in the $n^-$-type collector region of approximately 1E17 $cm^{-3}$. Additionally, by annealing before or after this step, impurity is diffused from the $p^+$-type base region 9 to make the p-type base lead-out region 9'.

After the resist 300 is removed, as shown in FIG. 36E, the base region 10 is made by ion implantation. Finally, the emitter region 11 and the external collector region 13 are made by ion implantation, and wirings for inter-layer insulating films or electrodes are made, to thereby complete BJT.

Figure 37A:
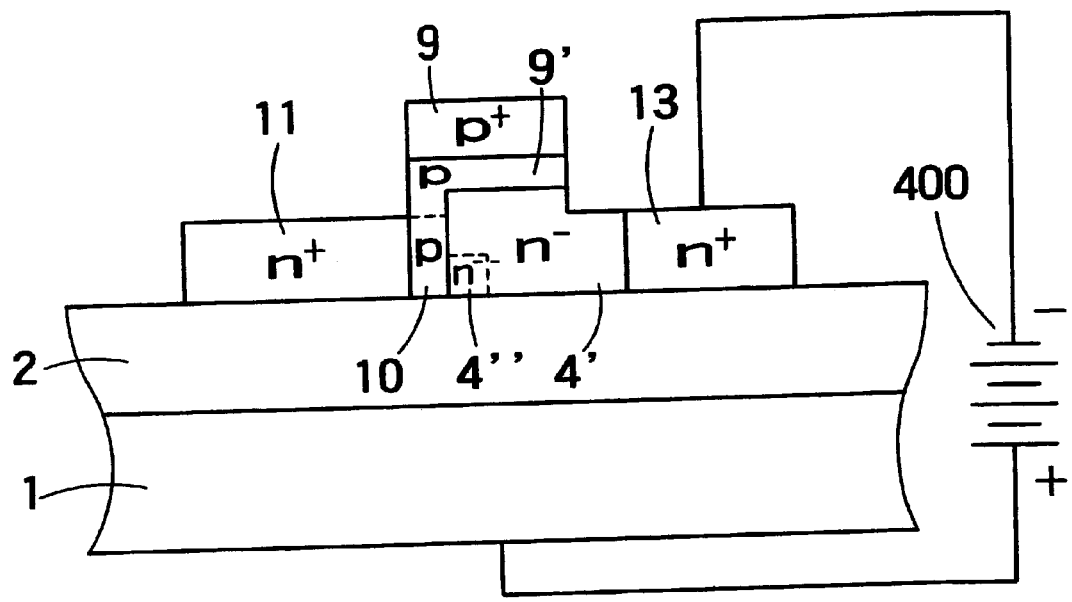
FIGS. 37A and 37B are diagrams for explaining another example of BJT according to the invention, which correspond to A–A' cross-sectional views of FIG. 1.
Figure 37B:
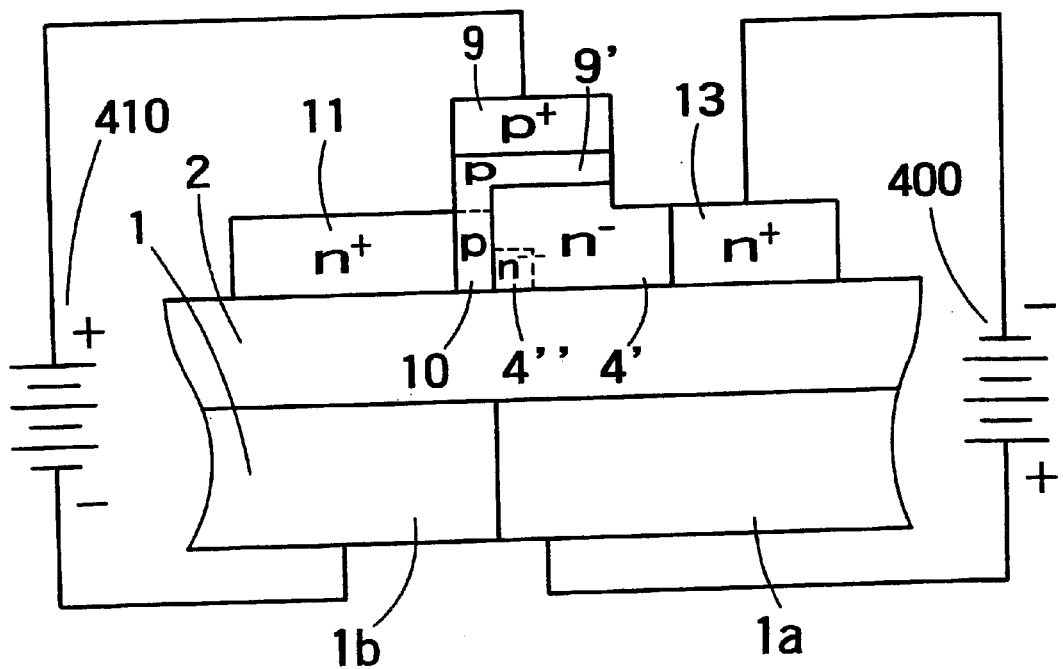

Next explained are examples shown in FIGS. 37A and 37B. BJT shown in FIGS. 37A and 37B is a version capable of positively controlling the path of the collector current by applying appropriate bias voltages between the collector or the base and the substrate.

In FIG. 37A, an $n^-$-type region 4" having a lower impurity concentration than that of the $n^-$-type collector region is provided a portion of the collector region nearer to the base, and a positive voltage for the collector is applied to the substrate 1. Numeral 400 denotes a power source for applying such a voltage. The $n^-$-type region 4" may be made prior to ion implantation to the base region 10 similarly to ion implantation in FIG. 36D.

In this example, electrons are accumulated under the collector region. As a result, in a portion under the collector region, carrier concentration becomes approximately equal to that of the collector region whereas, in the other portion, a higher carrier concentration than the collector region is made, That is, similarly to the example shown in FIG. 35, electrons flowing through the collector region can be made to mainly pass a region nearer to the oxide film 2, and various effects similar to those explained with reference to FIG. 35 can be obtained. That is, since electrons flow passing by the insulating film having a high carrier concentration in the collector region, it is possible to decrease the collector resistance and prevent the base expansion effect without degrading the collector withstanding voltage.

In BJT shown in FIG. 37B, the substrate 1 is separated into an n-type well 1a and a p-type well 1b. The boundary between these wells is made in accordance with the junction between the base region 10 and the collector region 4". In this manner, different bias voltages can be applied to the base region and the collector region, respectively. Thus, bias voltages of the illustrated polarities are applied to the collector and the base from power sources 400 and 410, respectively. In this manner, the path of the collector current can be controlled as explained with reference to FIG. 37A, and simultaneously, by applying bias voltages of opposite polarities also to the base region, a accumulation state can be made along a bottom portion of the intrinsic base region 10 nearer to the substrate as explained with reference to FIGS. 31 through 33, and stable operation without punch-through can be ensured. As a result, it is possible to reduce the collector resistance, prevent the base expansion effect and improve the punch-through resistance without degrading the collector withstanding voltage.

Next explained is an example shown in FIG. 38. This example has its feature on its plan-view pattern. The base lead-out region 9' is a p-type semiconductor approximately equal in impurity concentration to the intrinsic base region 10, and it is located at opposite sides of the intrinsic base region 10. The n-type collector region 4 is an n-type semiconductor region having a higher impurity concentration than the $n^-$-type collector region, and located in contact with the external collector region 13 and isolated from the intrinsic base region 10 and the base lead-out region 9'. The n-type collector region 4 may be made by ion implantation into a region defined by a mask.

Also in this example, electrons mainly flow through the n-type collector region near the center of the collector region. Therefore, it is possible to reduce the collector resistance and prevent the base expansion effect without degrading the collector withstanding voltage. As a result, a lateral bipolar transistor with a wide operation voltage range, wide operation current range and excellent high-frequency property can be made.

Next explained are further examples of the semiconductor device according to the invention.

FIGS. 39 through 42B are diagrams showing BJTs as further examples of the invention, and they correspond to the A–A' cross-sectional view of FIG. 1B. In these figures, the reference numeral 305 denotes $SiO_2$ layer and the reference numeral 310 denotes resist mask. These examples are directed to the lead-out portion connecting the $p^+$-type region 9 and the intrinsic base region 10 formed on the protrusion.

Figure 39:
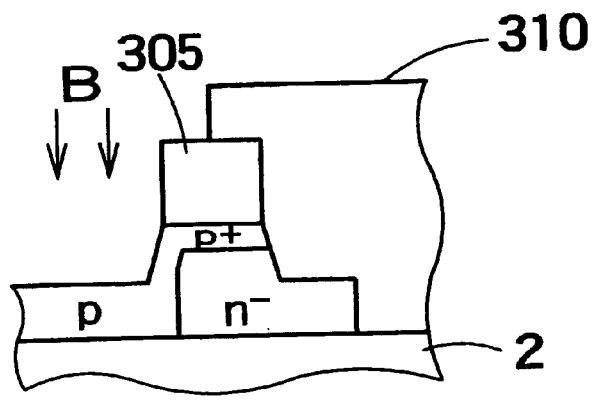
FIGS. 39 through 42B are diagrams schematically showing another example of methods for manufacturing BJT according to the invention, which correspond to A–A' cross-sectional views of FIG. 1.

That is, the example of FIG. 39 makes the lead-out portion by inclining side surfaces of the protrusion by a desired angle from the substrate surface so that an impurity be injected appropriately also into the side surfaces of the protrusion simultaneously with ion implantation to the base region 10. In this example, if the side surfaces are inclined far from the vertical direction, then the base impuity is excessively injected to the side surface portions. As a result, the base width of the base lead-out portion increases, and the performance degrades.

FIG. 43 is a graph showing a result of simulation to review relationship between the angle of a side surface of a protrusion relative to a substrate surface and the depth of a p-type region made on the side surface of the protrusion in which thickness of silicon of the emitter portion is approximately 0.1 μm when ions are implanted under three different conditions making 2E18 cm$^{-3}$, 4E18 cm$^{-3}$ and 7E18 cm$^{-3}$ as the base concentration. It is noted from FIG. 43 that a shallow diffusion layer as thin as 0.1 to 0.15 μm or less can be made when the angle of inclination is 65 through 85°. Additionally, it is noted that the angle of the side surfaces must be as steep as 80° to maintain a base width not larger than 0.1 μm.

Figure 40:
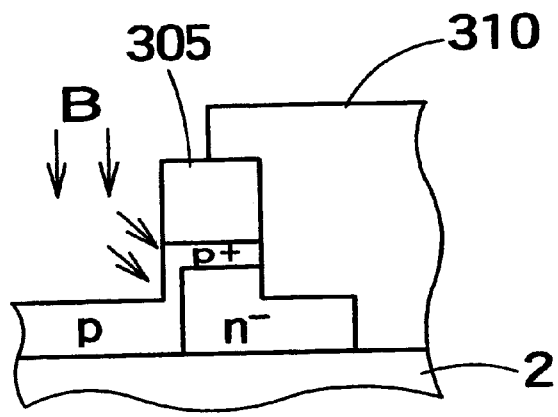

On the other hand, in the example shown in FIG. 40, the base lead-out region is made by injecting ions from a diagonal direction when the side surfaces of the protrusion are substantially vertical. In this case, by injecting an impurity from a direction inclined from the vertical direction of the substrate by approximately 10°, the base lead-out region similar to the case of FIG. 30 with inclination of 80° can be made.

Figure 41:
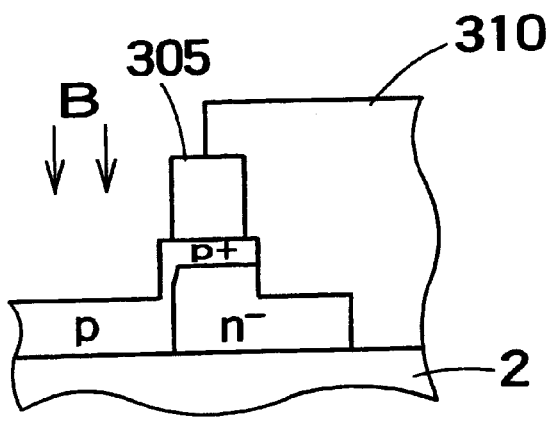

In the example shown in FIG. 41, by conducting ion implantation of the base after exposing shoulder portions of the SOI silicon layer by retreating the second mask material from side surfaces of the protrusion, the base lead-out region can be made automatically along the side surfaces.

Figure 42A:
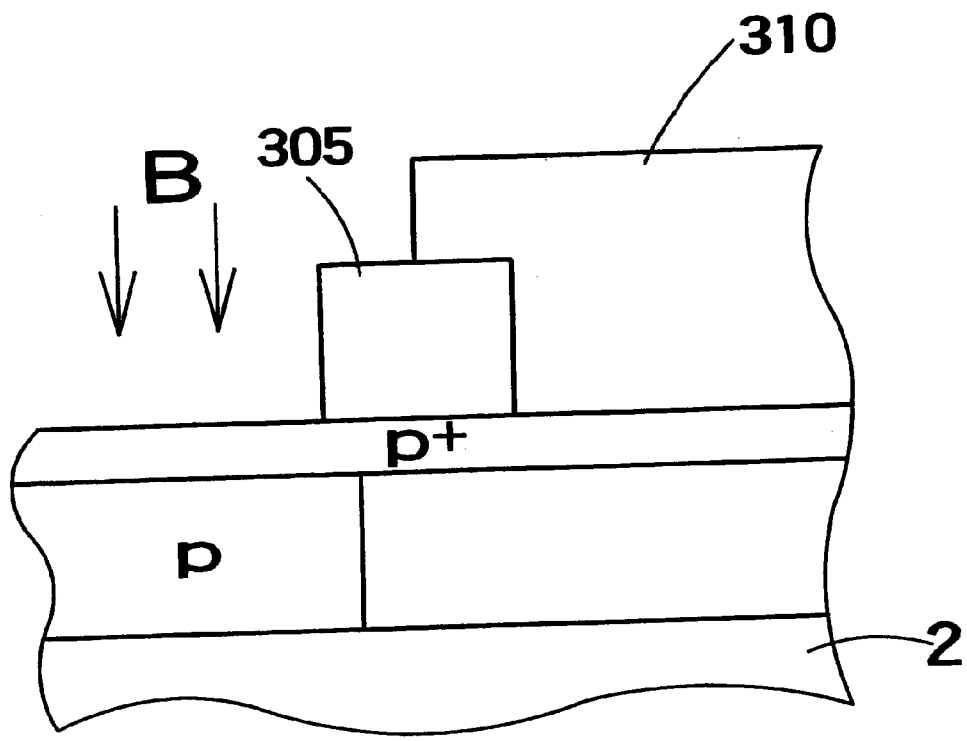
Figure 42B:
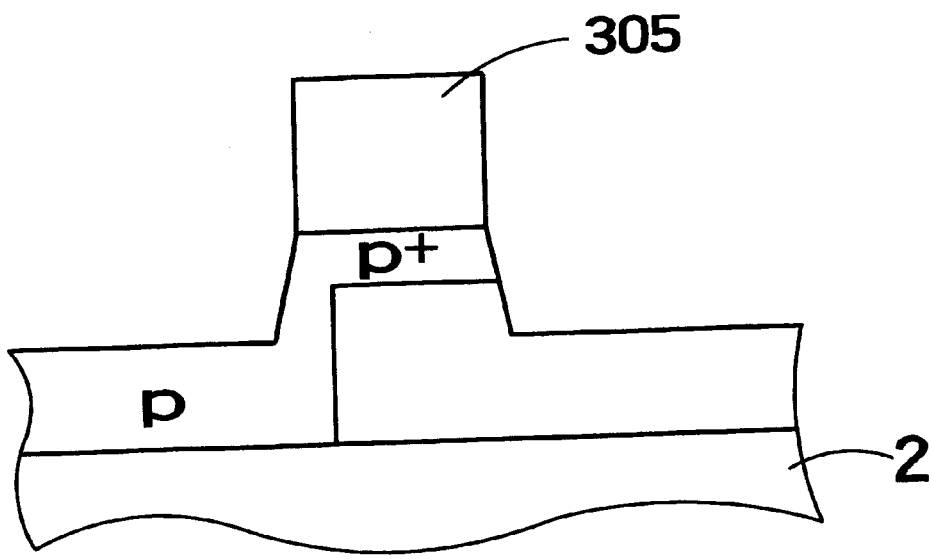

In the example shown in FIG. 42, before making the protrusion, ion implantation of the base and annealing, if necessary, are executed (FIG. 42A), and the protrusion is made thereafter. The p-type region shown in FIG. 42A extends laterally upon ion implantation or later annealing. Therefore, in FIG. 42B, by making the protrusion by using an etching method with less lateral withdrawal, such as RIE, the p-type base lead-out region can be maintained along the side walls of the protrusion. That is, according to this method, without the process of ion implantation onto side walls of the protrusion, the intrinsic base region and the p$^+$-type external base region can be connected.

Explained above are methods for reliably connecting the intrinsic base region and the external base region. However, these regions can be connected without these methods, by improving the processing accuracy of the protrusion. That is, by controlling the etching depth to reliably locate the p$^+$-type region within the upward diffusion distance of the intrinsic base region, the intrinsic base region and the external base region can be connected in self alignment.

Figure 44A:
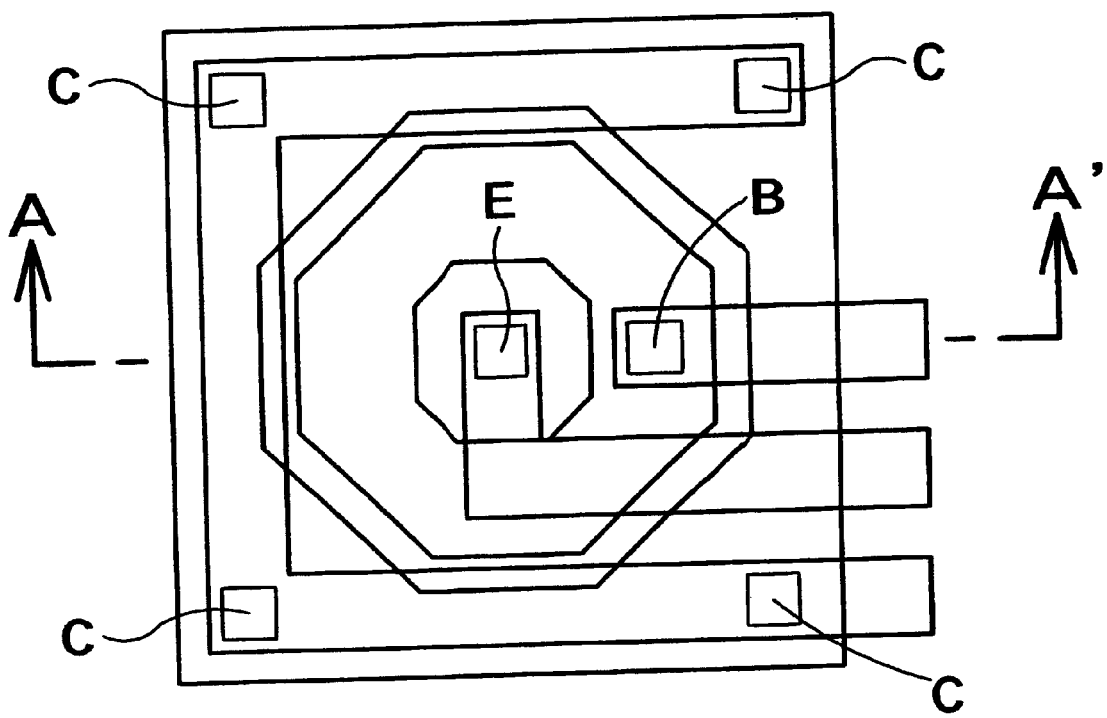
Figure 44B:
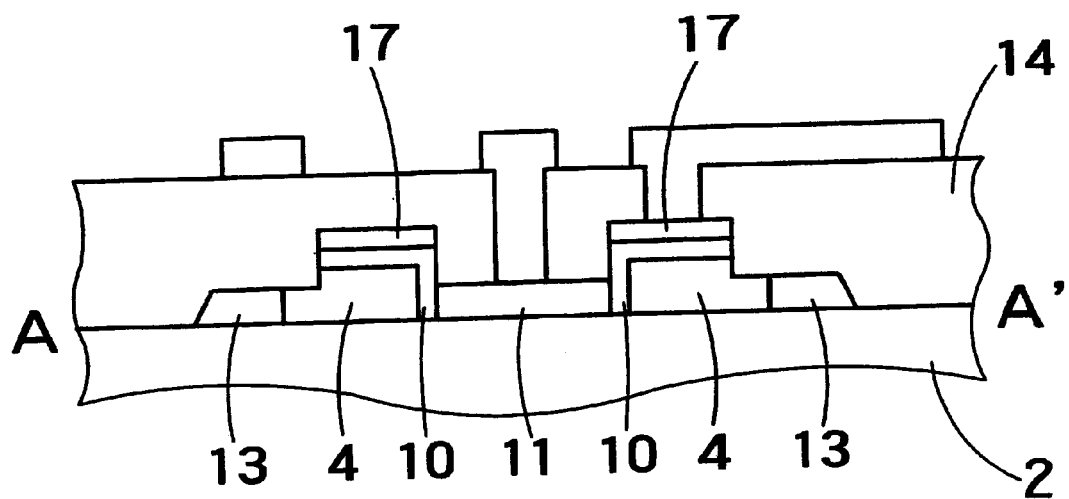
Figure 45A:
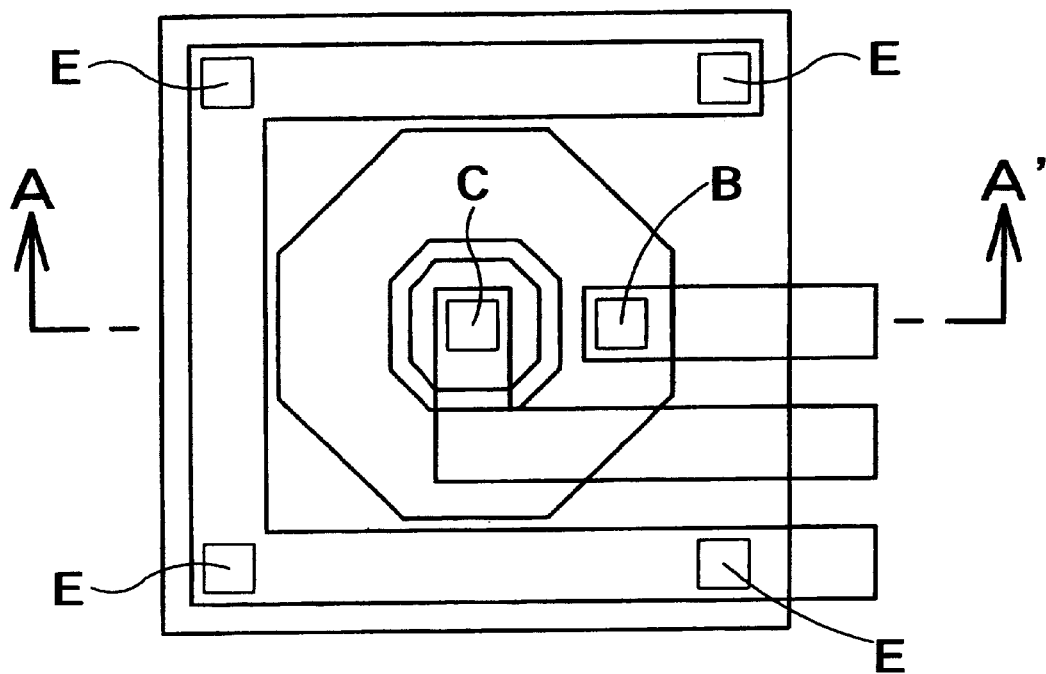
Figure 45B:
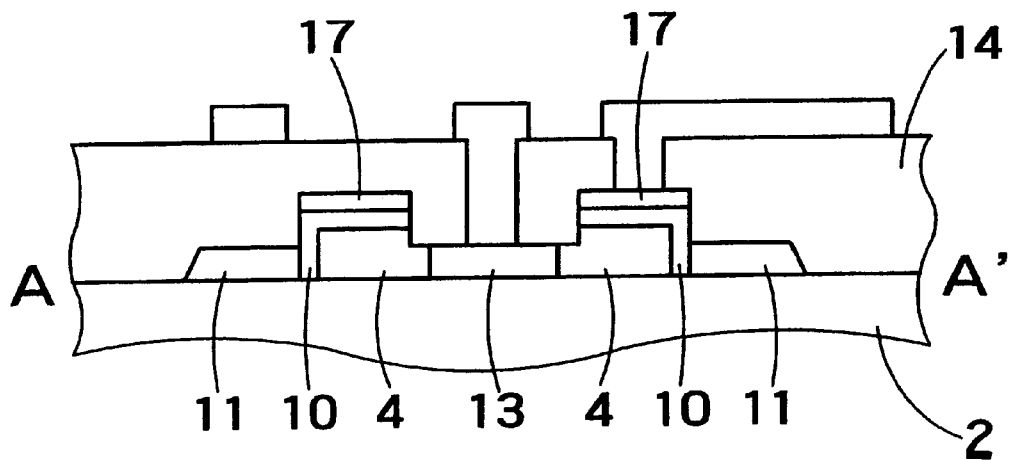

Next explained are further examples of the semiconductor device according to the invention. FIGS. 44A through 45B are diagrams showing BJTs taken as examples of the present invention. FIGS. 44A and 45A show patterns viewed through their top planes, and FIGS. 44B and 45B are their A–A' cross-sectional views. These examples have Corbino-type plan-view patterns to optimize two-dimensional placement patterns of the emitter, base and collector regions.

In the example of FIGS. 44A and 44B, an n-type region of the emitter is made in the center, the p-type region of the base is placed to surround the n-type region, and an n-type region of the collector surrounds the p-type region. In this manner, a Corbino type structure does not include any patterned edge of the SOI layer along the intrinsic region, no p-n junction is made on the processed end surfaces of the element region. Therefore, it is possible to improve the junction withstanding voltage and prevent the junction leakage.

Alternatively, by leaving damages on the patterned edge surfaces of the element region, these portions can be used as gettering sites of contaminants. In this manner, production yield of elements and their reliability can be improved.

FIGS. 45A and 45B show an example locating the collector region in the center and the base region and the emitter region therearound. Both the example of FIGS. 44A and 44B and the example of FIG. 45A and 45B can be made in the same process simultaneously, any of them can be appropriately selected depending upon requirements of circuits. For example, the transistor of FIGS. 45A and 45B may have a larger emitter size than the example of FIG. 44A and 44B having the same pattern area, whereas the example of FIGS. 44a and 44B may be reduced in collector resistance.

In these examples, the protrusion has an octagonal configuration. However, its configuration may be any of square, other polygonal or circular configurations. Additionally, although the silicide film 17 is formed on the surface of the protrusion to reduce the base resistance, a similar silicide film is preferably formed also on the emitter and collector portions, particularly on their outer marginal peripheries.

Besides, by employing the Corbino structure the fringe region as described above can be excluded from the base region. That is, the base region can be formed only by the intrinsic base region, lead-out region and external base region. Therefore, the problems caused by the fringe region can be avoided by employing the Corbino structure.

Explained below is a further example of the semiconductor device according to the invention.

FIGS. 46A through 46C are diagrams for explaining this example. FIG. 46A is a cross-sectional view schematically showing BJT according to this example, and it corresponds to the A–A' cross-sectional view of FIG. 1B. FIG. 46B is a diagram showing an impurity concentration profile viewed from the A–A' direction. FIG. 46C is a diagram showing an impurity concentration profile of a comparative example.

A feature of this example lies in using phosphorus (P) as the dopant of the high-concentrated n$^+$-type region to make the profile as shown in FIG. 46B. In the comparative example shown in FIG. 46C, arsenic (As) is used as the dopant. Comparing the profile of FIG. 46B with the profile of FIG. 46C, the steepness of the emitter profile is slightly degraded, and there is the possibility that the injection efficiency of hole into the emitter increases and the current gain may decrease. However, by using phosphorus (P) as the impurity, it can be prevented that the SOI layer changes to the amorphous phase upon injection of the emitter impurity, as explained with reference to FIGS. 10A through 10C. Its reason is as follows. When phosphorus (P) is used, even with shallow ion implantation, ions diffuse to and reach the bottom upon later annealing, and make the emitter region more firmly up to the bottom. Additionally, in case of phosphorus with an atomic weight lighter than arsenic (As), its critical doze amount causing change to the amorphous phase is higher, and there is a larger margin for the dose amount. As a result, it promises the advantage that increase of the emitter resistance and increase of junction leakage are prevented and a reliable device property is obtained. Additionally, by using phosphorus (P) in the external collector region, then conducting ion implantation of the external collector region in an initial stage of the manufacturing process, and annealing it sufficiently, it is possible to obtain a profile having a gentle inclination also near the external collector as shown in FIG. 46B. As a result, the Kirk effect, a problem of high-concentrated injection, can be suppressed without degrading the base-collector withstanding voltage. therefore, the high-frequency property can be improved.

Next explained is a further example of the semiconductor device according to the invention.

FIGS. 47A through 47C are schematic diagrams for explaining the example of the invention. They are cross-sectional views of the "transverse arm portions" of BJT from a direction corresponding to the B–B' line in FIG. 2A.

In general, when it is processed by RIE, "corners" are made at the bottom of the protrusion as shown in FIG. 47C. If the junction of the emitter and the base lies on the "corners", the junction leakage increases due to concentration of the electric field. In contrast, in this example, after withdrawing the buried oxide film as shown in FIG. 47A, the SOI silicon layer 3 is processed by isotropic etching to round the "corners" as shown in FIG. 47B. In this manner, even when the junction of the emitter and the base ides there, concentration of the electric field is alleviated, and increases of the junction leakage is prevented. However, even without the process for withdrawal shown in FIG. 47A, leakage at the upper corners can be prevented, and this example is still effective.

Next explained is a further example of the semiconductor device according to the invention.

Figure 48:
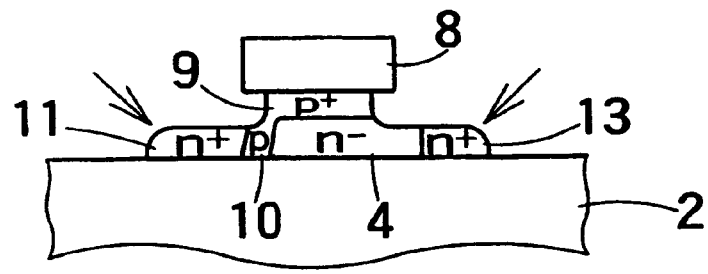
FIG. 48 is a schematic diagram for explaining an example of the invention, which corresponds to an A–A' cross-sectional view of FIG. 1.
Figure 49:
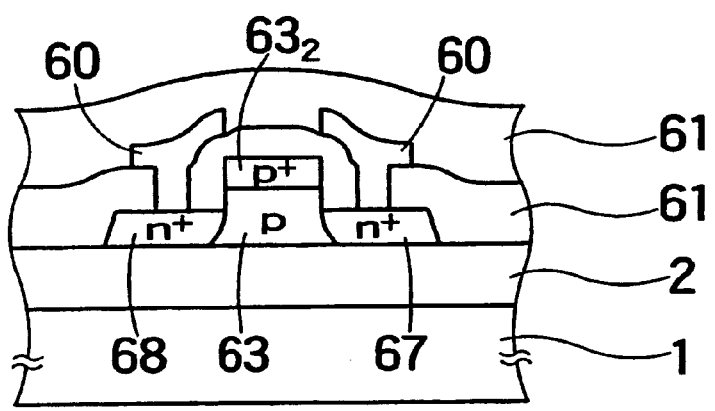
FIG. 49 is a cross-sectional view schematically showing construction of a first conventional BJT.
Figure 50:
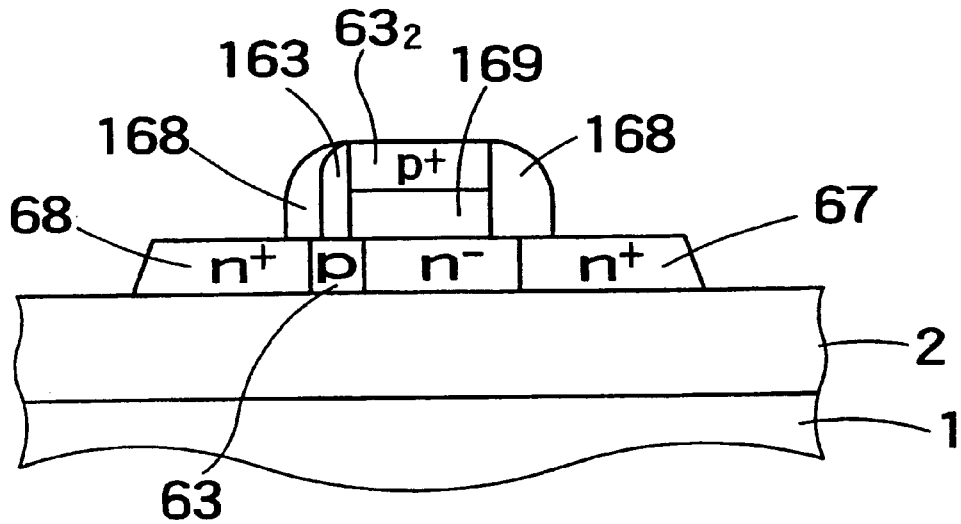
FIG. 50 is a cross-sectional view schematically showing construction of a second conventional BJT.

FIG. 48 is a schematic diagram for explaining the example of the invention, and it corresponds to the A–A' cross-sectional view of FIG. 1B.

A feature of this example lies in that the end corners of the SOI layer are withdrawn in an isotropic manner to form a round shape. It can be made, for example, by using CDE (chemical dry etching) after etching the SOI layer to an intermediate depth by RIE in the patterning process of the SOI layer explained with reference to FIGS. 9A through 9C, or alternatively by originally etching exclusively by CDE.

By shaping the protrusion in this manner, in addition to the effects set forth with reference to FIG. 34, the use of isotropic etching makes it possible to obtain the configuration in which the side surfaces of the SOI layer retreat relative to the second mask material 8 on the "longitudinal arm portion". As a result, without making the 35 side wall spacer before ion implantation of the base or the emitter, the base width can be maintained reliably. That is, slanted ion implantation is combined for ion implantation of the base impurity, and emitter ion implantation is done from an approximately vertical direction. Even when ions are implanted to the base from a diagonal direction, since the side walls of the protrusion are withdrawn, ions are never implanted excessively. Therefore, this structure prevents deterioration in property due to the base lead-out portion on the side surface of the protrusion being made wide and increasing the base width accordingly.

Additionally, since the configuration of the junction between the emitter and the base is shaped into a round configuration instead of a rectangular configuration, and plasma damages are removed, the problem of junction leakage is removed, and the device property is further improved.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A bipolar transistor, comprising;
an insulating layer having a major surface;
an island of single crystal semiconductor material selectively formed on said major surface of the insulating layer, said island including a collector region of a first conductivity type and an intrinsic base region of a second conductivity type located adjacent to said collector region; and
an emitter region of the first conductivity type located adjacent to said intrinsic base region,
wherein said island includes a monolithic protrusion projecting vertically upward relative to said major surface of said insulating layer located on said intrinsic base region,
said monolithic protrusion includes a part of said collector region,
said monolithic protrusion includes an external base region of the second conductivity type located near the uppermost layer thereof and having a higher impurity concentration than said intrinsic base region,
said monolithic protrusion further includes a base lead-out region of the second conductivity type formed along a side surface thereof and connecting said intrinsic base region and said external base region,
a width of said external base region, which runs parallel to a line running between said emitter region and said collector region, is larger than a width of said intrinsic base region, which runs parallel to a line running between said emitter region and said collector region, and
a junction area between region and the external base region, the base lead-out region and the intrinsic base region is larger than a junction area between the intrinsic base region and the emitter region.

2. The bipolar transistor according to claim 1, wherein said monolithic protrusion is configured so that a side surface thereof nearer to said collector region substantially coincides with a head end of a depletion region, which extends from said intrinsic base region into said collector region, during operation of said bipolar transistor.

3. The bipolar transistor for according to claim 1, wherein said monolithic protrusion is configured so that the lower end of a side surface thereof substantially coincides with a head end of a depletion region, which extends from said external base region toward said insulating layer into said collector region, during operation of said bipolar transistor.

4. The bipolar transistor according to claim 1, wherein said collector region includes:
a first collector region located adjacent said intrinsic base region and having a first impurity concentration, and
a second collector region located adjacent to said first collector region and having a second impurity concentration higher than said first impurity concentration,
wherein a head end of a depletion region extending from said intrinsic base region and said base lead-out region during operation of said bipolar transistor substantially coincides with a junction between said first collector region and said second collector region.

5. The bipolar transistor according to claim 1, further comprising a layer made of a silicide or a metal located in contact with said external base region on said monolithic protrusion.

6. A bipolar transistor, comprising:
an insulating layer having a major surface;
an island of single crystal semiconductor material selectively formed on said major surface of the insulating layer, said island including a collector region of a first conductivity type and an intrinsic base region of a second conductivity type located adjacent to said collector region; and an emitter region of the first conductivity type located adjacent to said intrinsic base region, wherein said island includes a protrusion projecting vertically upward relative to said major surface of said insulating layer located on said intrinsic base region, said protrusion includes a protruding portion of said collector region, said protrusion includes an external base region of the second conductivity type located near the uppermost layer thereof and having a higher impurity concentration than said intrinsic base region, said external base region covering the protruding portion of said collector region, said protrusion further includes a base lead-out region of the second conductivity type formed along a side surface thereof and connecting said intrinsic base region and said external base region, and such that said external base region and base lead-out region are monolithic, and a width of said external base region, which runs parallel to a line running between said emitter region and said collector region, is larger than a width of said intrinsic base region, which runs parallel to a line running between said emitter region and said collector region.

7. The bipolar transistor according to claim 6, wherein said protrusion is configured so that a side surface thereof nearer to said collector region substantially coincides with a head end of a depletion region which extends from said intrinsic base region into said collector region during operation of said bipolar transistor.

8. The bipolar transistor according to claim 6, wherein said protrusion is configured so that the lower end of a side surface thereof substantially coincides with a head end of a depletion region which extends from said external base region toward said insulating layer into said collector region during operation of said bipolar transistor.

9. The bipolar transistor according to claim 6, wherein said collector region includes:

a first collector region located adjacent to said intrinsic base region and having a first impurity concentration, and a second collector region located adjacent said first collector region an d having a second impurity concentration higher than said first impurity concentration, wherein a head end of a depletion region extending from said intrinsic base region and said base lead-out region during operation of said bipolar transistor substantially coincides with a junction between said first collector region and said second collector region.

10. The bipolar transistor according to claim 6 further comprising a layer made of a silicide or a metal located in contact with said external base region on said protrusion.

* * * * *